(12) United States Patent
Murai et al.

(10) Patent No.: US 8,334,151 B2
(45) Date of Patent: Dec. 18, 2012

(54) METHOD FOR FABRICATING A DIRECT WAFER BONDED OPTOELECTRONIC DEVICE

(75) Inventors: Akihiko Murai, Goleta, CA (US); Christina Ye Chen, Santa Clara, CA (US); Daniel B. Thompson, Goleta, CA (US); Lee S. McCarthy, Santa Barbara, CA (US); Steven P. DenBaars, Goleta, CA (US); Shuji Nakamura, Santa Barbara, CA (US); Umesh K. Mishra, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 236 days.

(21) Appl. No.: 12/752,977

(22) Filed: Apr. 1, 2010

(65) Prior Publication Data
US 2010/0187555 A1    Jul. 29, 2010

Related U.S. Application Data

(62) Division of application No. 11/454,691, filed on Jun. 16, 2006, now Pat. No. 7,719,020.

(60) Provisional application No. 60/691,710, filed on Jun. 17, 2005, provisional application No. 60/732,319, filed on Nov. 1, 2005, provisional application No. 60/764,881, filed on Feb. 3, 2006.

(51) Int. Cl.
*H01L 21/00* (2006.01)

(52) U.S. Cl. ............... 438/22; 438/29; 438/39; 438/40; 438/46; 438/455; 438/458; 257/13; 257/E25.02; 257/E33.068; 257/E33.072

(58) Field of Classification Search ..................... None
See application file for complete search history.

(56) References Cited

U.S. PATENT DOCUMENTS

| | | | |
|---|---|---|---|
| 3,607,463 | A | 9/1971 | Kinoshita et al. |
| 5,696,389 | A | 12/1997 | Ishikawa et al. |
| 5,932,048 | A | 8/1999 | Furukawa et al. |
| 6,155,699 | A | 12/2000 | Miller et al. |
| 6,357,889 | B1 | 3/2002 | Duggal et al. |

(Continued)

FOREIGN PATENT DOCUMENTS

EP    1081771    3/2001

(Continued)

OTHER PUBLICATIONS

Carlin et al., "High-quality AlInN for high index contrast Bragg mirrors lattice matched to GaN", Applied Physics Letters, Jul. 28, 2003, 83(4).

(Continued)

*Primary Examiner* — Zandra Smith
*Assistant Examiner* — Khanh Duong
(74) *Attorney, Agent, or Firm* — Gates & Cooper LLP

(57) ABSTRACT

An (Al, Ga, In)N and ZnO direct wafer bonded light emitting diode (LED), wherein light passes through electrically conductive ZnO. Flat and clean surfaces are prepared for both the (Al, Ga, In)N and ZnO wafers. A wafer bonding process is then performed between the (Al, Ga, In)N and ZnO wafers, wherein the (Al, Ga, In)N and ZnO wafers are joined together and then wafer bonded in a nitrogen ambient under uniaxial pressure at a set temperature for a set duration. After the wafer bonding process, ZnO is shaped for increasing light extraction from inside of LED.

13 Claims, 20 Drawing Sheets

U.S. PATENT DOCUMENTS

| | | | |
|---|---|---|---|
| 6,486,499 B1 * | 11/2002 | Krames et al. | 257/81 |
| 6,514,782 B1 * | 2/2003 | Wierer, Jr. et al. | 438/22 |
| 6,525,335 B1 | 2/2003 | Krames et al. | |
| 6,569,544 B1 | 5/2003 | Alain et al. | |
| 6,746,295 B2 | 6/2004 | Sorg | |
| 6,955,985 B2 | 10/2005 | Narayan | |
| 6,989,555 B2 | 1/2006 | Goetz et al. | |
| 6,998,281 B2 | 2/2006 | Taskar et al. | |
| 7,098,589 B2 | 8/2006 | Erchak et al. | |
| 7,119,271 B2 | 10/2006 | King et al. | |
| 2002/0123204 A1 | 9/2002 | Torvik | |
| 2002/0130327 A1 | 9/2002 | Wu et al. | |
| 2002/0141006 A1 | 10/2002 | Pocius et al. | |
| 2003/0145884 A1 | 8/2003 | King et al. | |
| 2004/0079408 A1 | 4/2004 | Fetzer et al. | |
| 2004/0089868 A1 | 5/2004 | Hon et al. | |
| 2004/0188689 A1 | 9/2004 | Shono et al. | |
| 2004/0211970 A1 | 10/2004 | Hayashimoto et al. | |
| 2005/0029528 A1 | 2/2005 | Ishikawa | |
| 2005/0082562 A1 | 4/2005 | Ou et al. | |
| 2005/0156510 A1 | 7/2005 | Chua et al. | |
| 2005/0189551 A1 | 9/2005 | Peng et al. | |
| 2005/0205884 A1 | 9/2005 | Kim et al. | |
| 2005/0274956 A1 | 12/2005 | Bhat | |
| 2006/0163586 A1 | 7/2006 | DenBaars et al. | |
| 2006/0202226 A1 | 9/2006 | Weisbuch et al. | |
| 2006/0233969 A1 | 10/2006 | White et al. | |
| 2007/0072324 A1 * | 3/2007 | Krames et al. | 438/46 |
| 2007/0102721 A1 | 5/2007 | DenBaars et al. | |
| 2007/0121690 A1 | 5/2007 | Fujii et al. | |

FOREIGN PATENT DOCUMENTS

| | | |
|---|---|---|
| JP | 2003-017740 | 1/2003 |
| JP | 2005-056922 | 3/2005 |
| JP | 2005-117006 | 4/2005 |
| WO | 2005083037 | 9/2005 |
| WO | WO2007067758 | 6/2007 |

OTHER PUBLICATIONS

Fujii, T. et al., "Increase in the extraction efficiency of GaN-based light-emitting diodes via surface roughening," Appl. Phys. Lett. 2004, 855-857, 84(6).

Jasinski, J. et al., "Microstructure of GaAs/GaN interfaces produced by direct wafer fusion," Appl. Phys. Lett. 2002, 3152-3154, 81(17).

Kish, F.A., "Very high-efficiency semiconductor wafer-bonded transparent-substrate $(Al_xGa_{1-x})_{0.5}In_{0.5}P/GaP$ light-emitting diodes," Appl. Phys. Lett. 1994, 2839-2841, 64(21).

Liau, Z.L. et al., "Wafer fusion: A novel technique for optoelectronic device fabrication and monolithic integration," Appl. Phys. Lett., 1990, 737-739, 56(8).

Murai, A. et al., "Wafer Bonding of GaN and ZnSSe for Optoelectronic Applications," Jpn. J. Appl. Phys. 2004, L1275-L1277, 43(10A) (2004).

Nakamura, S. et al., "High-Brightness InGaN Blue, Green and Yellow Light-Emitting Structures," Jpn. J. Appl. Phys. 1995, L797-L799 34.

Nakahara, K. et al., "Improved External Efficiency InGaN-Based Light-Emitting Diodes with Transparent Conductive Ga-Doped ZnO as p-Electrodes," Jpn. J. Appl. Phys. 2004, L180-L182, 43(2A).

Ohshima, E. et al., "Growth of the 2-in-size bulk ZnO single crystals by the hydrothermal method," J. of Crystal Growth 2004, 166-170, 260.

Sink et al., "Cleaved GaN facets by wafer fusion of GaN to InP," Apr. 8, 1996, Appl. Phy. Lett. 68(15).

Smathers et al., "Nanometer scale surface clustering on ZnSe epilayers", Applied Physics Letters, Mar. 9, 1998, 72(10).

Someya et al., "Highly reflective $GaN/Al_{0.34}Ga_{0.66}N$ quarter-wave reflectors grown by metal organic chemical vapor deposition", Appl. Phys. Lett, Dec. 21, 1998, 73(25).

Japanese Office Action dated Oct. 4, 2011 for application No. 2008-517176 (with translation).

PCT International Search Report for international application No. PCT/US2006/023588 filed on Jun. 16, 2006.

* cited by examiner 1 mm

METHOD FOR FABRICATING A DIRECT WAFER BONDED OPTOELECTRONIC DEVICE

CROSS-REFERENCE TO RELATED APPLICATIONS

This application is a divisional under 35 U.S.C. Section 121 of commonly-assigned U.S. Utility application Ser. No. 11/454,691, filed on Jun. 16, 2006, by Akihiko Murai, Christina Ye Chen, Daniel B. Thompson, Lee S. McCarthy, Steven P. DenBaars, Shuji Nakamura, and Umesh K. Mishra, entitled "(Al,Ga,In)N AND ZnO DIRECT WAFER BONDED STRUCTURE FOR OPTOELECTRONIC APPLICATIONS, AND ITS FABRICATION METHOD," now U.S. Pat. No. 7,719,020, issued May 18, 2010, which application claims the benefit under 35 U.S.C. Section 119(e) of the following commonly-assigned U.S. patent applications:

U.S. Provisional Application Ser. No. 60/691,710, filed on Jun. 17, 2005, by Akihiko Murai, Christina Ye Chen, Lee S. McCarthy, Steven P. DenBaars, Shuji Nakamura, and Umesh K. Mishra, entitled "(Al,Ga,In)N AND ZnO DIRECT WAFER BONDING STRUCTURE FOR OPTOELECTRONIC APPLICATIONS AND ITS FABRICATION METHOD,";

U.S. Provisional Application Ser. No. 60/732,319, filed on Nov. 1, 2005, by Akihiko Murai, Christina Ye Chen, Daniel B. Thompson, Lee McCarthy, Steven P. DenBaars, Shuji Nakamura, and Umesh K. Mishra, entitled "(Al, Ga, In)N AND ZnO DIRECT WAFER BONDED STRUCTURE FOR OPTOELECTRONIC APPLICATIONS, AND ITS FABRICATION METHOD,"; and U.S. Provisional Application Ser. No. 60/764,881, filed on Feb. 3, 2006, by Akihiko Murai, Christina Ye Chen, Daniel B. Thompson, Lee S. McCarthy, Steven P. DenBaars, Shuji Nakamura, and Umesh K. Mishra, entitled "(Al,Ga,In)N AND ZnO DIRECT WAFER BONDED STRUCTURE FOR OPTOELECTRONIC APPLICATIONS AND ITS FABRICATION METHOD,";

all of which applications are incorporated by reference herein.

This application is related to the following co-pending and commonly-assigned application:

U.S. Provisional Application Ser. No. 60/734,040, filed on Nov. 11, 2005, by Steven P. DenBaars, Shuji Nakamura, Hisashi Masui, Natalie N. Fellows, and Akihiko Murai, entitled "HIGH LIGHT EXTRACTION EFFICIENCY LIGHT EMITTING DIODE (LED),";

U.S. Provisional Application Ser. No. 60/748,480, filed on Dec. 8, 2005, by Steven P. DenBaars, Shuji Nakamura and James S. Speck, entitled "HIGH EFFICIENCY LIGHT EMITTING DIODE (LED),"; and U.S. Provisional Application Ser. No. 60/764,975, filed on Feb. 3, 2006, by Steven P. DenBaars, Shuji Nakamura and James S. Speck, entitled "HIGH EFFICIENCY LIGHT EMITTING DIODE (LED),";

all of which applications are incorporated by reference herein.

BACKGROUND OF THE INVENTION

1. Field of the Invention

This invention is related to wafer bonding for optoelectronic applications. More particularly, the invention relates to a (Al, Ga, In)N and ZnO direct wafer bonding structure for highly efficient (Al, Ga, In)N based light emitting diodes and for optoelectronic applications, and its fabrication method.

2. Description of the Related Art (Note: This application references a number of different publications as indicated throughout the specification. A list of these different publications can be found below in the section entitled "References." Each of these publications is incorporated by reference herein.)

Wafer bonding technology using different combinations of materials, such as InP/GaAs, AlGaInP/GaP, GaAs/GaN, ZnSSe/GaN, has been studied for applications in optoelectronic integration, light emitting diodes (LEDs), vertical cavity surface emitting lasers (VCSELs), and electronic devices [1,2,3,4].

In a nitride LED system, there are several reports of fabricating transparent electrodes on a p-type GaN layer. The general method is to use thin metals of Ni and Au [5]. Because of the light absorption in the metal, transmittance is only around 60%. Also, surface feature shaping for improving light extraction efficiency is difficult because of the hardness of GaN material and the instability of p-type GaN conductivity.

Another approach is to use Zinc Oxide (ZnO) layer growth on p-type GaN [6]. However, this method requires using ZnO crystal growth equipment and ultra-high vacuum conditions. Moreover, it is difficult to grow the thick layers, e.g., ~500 µm thick layers, that are suitable for feature shaping for the purpose of light extraction.

What is needed are improved methods of wafer bonding in the above-identified material systems. The present invention satisfies that need, and comprises the first demonstration of a direct wafer bonding between (Al, Ga, In)N and ZnO wafers.

SUMMARY OF THE INVENTION

The present invention describes a III-nitride optoelectronic device comprised of an n-type III-nitride, an active region, and a p-type III-nitride; one or more transparent conductor layers wafer bonded to one or more sides of the III-nitride optical device, wherein light passes through the transparent conductor layers, the transparent conductor layers reduce light absorption inside the III-nitride because they are transparent, and the transparent conductor layers enable uniform light emitting from the active region because they are electrically conductive.

The transparent conductor layers may comprise Zn(O, S, Te), Indium Tin Oxide, Gallium Oxide, Indium Gallium Zinc Oxide, $In_2O_2/SnO_2$ (Indium Tin Oxide, ITO), n-type or p-type material. The III-nitride optoelectronic device may comprise c-plane III-nitride and the transparent conductor layers may comprise c-plane ZnO layers.

Further, the transparent conductor layers may be roughened or shaped, for example to reduce light reflections occurring repeatedly inside the LED, and thus extract more light out of the LED. The transparent conductor layers may be ZnO and an O-face of the ZnO's surface may be shaped. The transparent conductor layers may be shaped to one or more truncated hexagonal pyramids, or roughened or shaped transparent conductor layers may have {10-11} plane surfaces which form a polyhedron. It may be that a polar face of the transparent conductor layers is wafer bonded to a III-nitride wafer.

The optical device may further comprising an intermediate contact layer deposited on the p-type III-nitride or n-type III-nitride. The intermediate contact layer may comprise an interdigitated contact layer. The interdigitated contact layer may be patterned as a lattice, so that intersititial gaps in the layer pass light through from the III-nitride optical device, or the intermediate contact layer may comprise a bulk contact layer. The intermediate contact layer may be transparent or translucent. The intermediate contact layer may comprise a thin metal of Pt, Al, Ni, Au or Ti inserted between III-nitride optoelectronic device and the transparent conductor layers that enables less electrical resistance at a wafer bonded interface.

The optical device may further comprise at least one n-type electrode and at least one p-type electrode. The p-type electrode may be formed on n-type ZnO. The n-type electrode may be formed on Ga-faced n-type GaN or the n-type electrode may be formed on N-faced n-type GaN. The III-nitride optoelectronic device may be formed on a suitable substrate.

The present invention further discloses a method for producing a direct wafer bonded optical device, wherein light passes through one or more transparent conductor layers. The method may comprise (a) preparing flat and clean surfaces for one or more transparent conductor layers and a III-nitride optoelectronic device to be bonded; and (b) performing a direct wafer bonding process between the III-nitride optoelectronic device and the transparent conductor layers. The transparent conductor layers may comprise Zn(O, S, Te), Indium Tin Oxide, Gallium Oxide, Indium Gallium Zinc Oxide, $In_2O_3/SnO_2$ (Indium Tin Oxide, ITO). The transparent conductor layers surfaces to be bonded may comprise the Zn-face of c-plane ZnO or the O-face of c-plane ZnO The III-nitride optoelectronic device and the transparent conductor layers may be joined together and then wafer bonded in a nitrogen ambient under uniaxial pressure at a set temperature for a set duration. The III-nitride optoelectronic device and the transparent conductor layers may be loaded into a wafer-bonding furnace, and the furnace heated to a temperature of 600° C. for 1 hour in an $N_2$ gas flow.

The method may further comprise enhancing electrical conductivity of a wafer bonded interface prior to direct wafer bonding. The transparent conductor layers' surface may be plasma treated prior to the wafer bonding process to enhance electrical conductivity at the wafer bonded interface. The III-nitride optoelectronic device surface may be partially shaped prior to the wafer bonding process, and thus enabling a strong wafer bonded interface.

The method may further comprise a surface of the transparent conductor layers roughened or shaped by, for example an anisotropic etching after or before the wafer bonding process. The transparent conductor layers' surface may be an O-face of the ZnO. The anisotropic etching may be a chemical etching. The etching may use HCl or diluted HCl. The present invention further discloses an optical device fabricated by this method.

BRIEF DESCRIPTION OF THE DRAWINGS

Referring now to the drawings in which like reference numbers represent corresponding parts throughout:

FIGS. 11 (a) and (b) are schematic cross-sections of the wafer bonded LEDs having different ZnO wafer shapes.

FIGS. 12 (a) and (b) are schematic cross-sections of the wafer bonded LEDs having different ZnO shapes and without a sapphire substrate.

FIGS. 13 (a), (b) and (c) are schematic cross-sections of wafer bonded LEDs having different ZnO wafer shapes located on the bottom side of the LED.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The purpose of the present invention is to provide a means of increasing the light extraction efficiency from an LED by the direct wafer bonding of (Al, Ga, In)N and ZnO wafers followed by ZnO shaping.

Producing highly transparent and conductive electrodes, especially surface feature shaped electrode fabrication on p-type GaN, is difficult. Conventionally, a thin metal combination of Ni and Au is used for the p-electrode, which has a transmittance of only around 60% for optical wavelengths of less than 470 nm.

On the other hand, a ZnO wafer is highly transparent (with a transmittance of more than 80%) for relatively short optical wavelengths (of more than 360 nm), as well as being electrically conductive.

Through wafer bonding (fusion) techniques, this ZnO material can be used in a GaN related optical device structure. Moreover, a ZnO surface feature can be easily shaped by chemical etching to improve light extraction from the ZnO into the air.

By increasing light transmittance and light extraction, subsequent device performance is expected to increase. Potential optical devices, which utilize wafer-bonding structures, include blue and ultraviolet LEDs. Moreover, the method of the present invention is simple, repeatable and should not damage the material.

Technical Description

Figure 1:
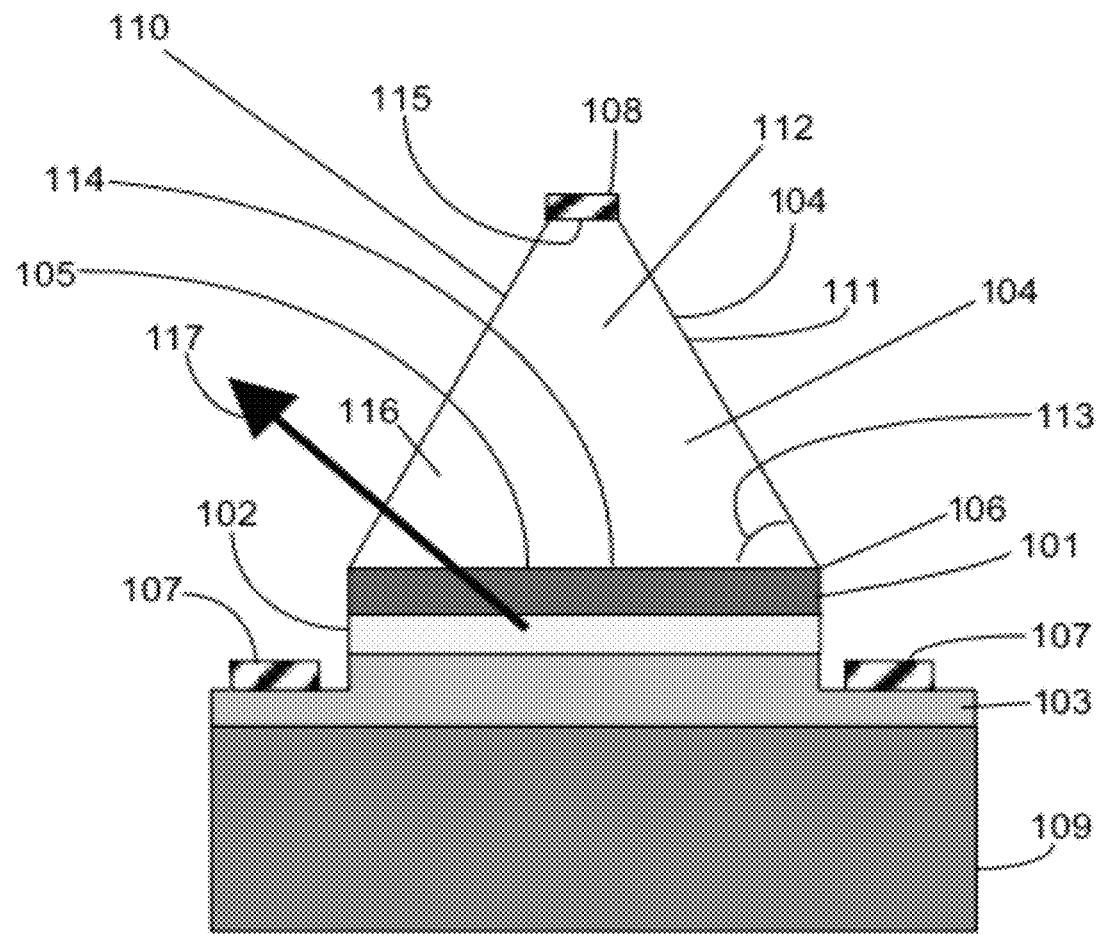
FIG. 1 is a schematic cross-section of a (Al, Ga, In)N and ZnO direct wafer-bonded LED structure.

FIG. 1 is a schematic cross-section of one embodiment of an optical device, a (Al, Ga, In)N and ZnO wafer-bonded LED, such as an (Al, Ga, In)N and Zinc Oxide (ZnO) wafer-bonded LED. In this embodiment a III-nitride optoelectronic device or wafer comprises an LED comprising p-type III-nitride (101), an active region (102), an n-type III-nitride (103). One or more n-type ZnO layers (104) are wafer bonded to one or more sides (105) of the III-nitride optoelectronic device or wafer to form at least one direct wafer bonding interface (106). At least one n-type electrode (107) and a p-type electrode (108) may also be deposited on the wafer bonded LED, in this embodiment the p-type electrode (108) is deposited on the n-type ZnO (104) and the n-type electrode (107) is deposited on the n-type III-nitride (103).

In FIG. 1, the p-type III-nitride (101), active region (102) and n-type III-nitride (103) are comprised of an (Al, Ga, In)N alloy which may be deposited on a suitable substrate such as sapphire (109).

Chemical etching is used to shape the exposed ZnO wafer surface (110) into a one or more inclined surfaces (111) to form at least one truncated hexagonal pyramid or cone (112). The inclined surfaces (111) may be inclined at a critical angle (113) relative to the direct wafer bonded interface (106). It is important that the face (114) of the ZnO (104) which is wafer bonded to the III-nitride optoelectronic device, in this case the p-type III-nitride layer (101), is a Zn face. This is so that the O-face (115) of the ZnO surface can be shaped or roughened, for example to form inclined planar surfaces (111) which may comprise a {1 0-1 1} plane and form a polyhedron (116). The ZnO (104) may be c-plane. Alternatively, the face (114) wafer bonded to a III-nitride wafer may be a face having a polar orientation (a polar face).

The p-type electrode (108) consists of titanium/aluminum/nickel/gold (Ti/Al/Ni/Au) and may be deposited on the top of the at least one truncated hexagonal pyramid or cone (112), and the n-type electrode (107) consists of titanium/gold (Ti/Au). FIG. 1 also illustrates one possible trajectory (117) for extracted light.

Figure 2:
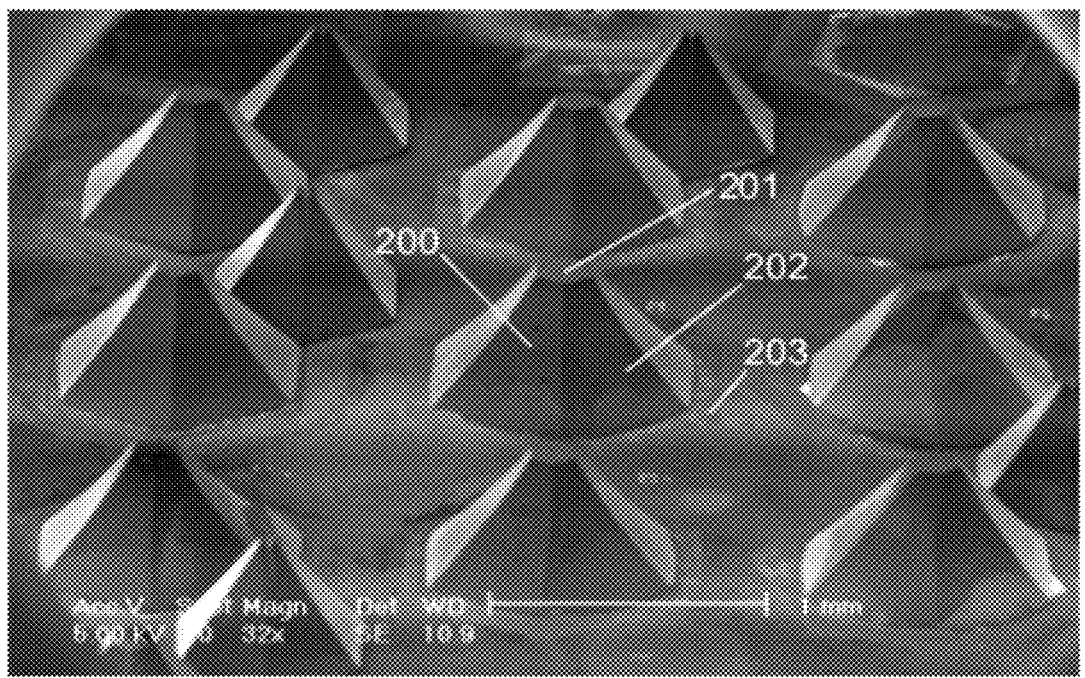
FIG. 2 is a scanning electron micrograph (SEM) image of the wafer-bonded LED.

FIG. 2 is a scanning electron micrograph (SEM) image of the fabricated wafer-bonded LED, showing the preferred embodiment, where the one or more ZnO layers have been shaped to one or more polyhedrons, in this case one or more truncated hexagonal pyramids (200), comprising at least one p-type electrode on the truncated top (201) of at least one truncated hexagonal pyramid (200) of n-type ZnO (202) and an n-type electrode (203).

Figure 3:
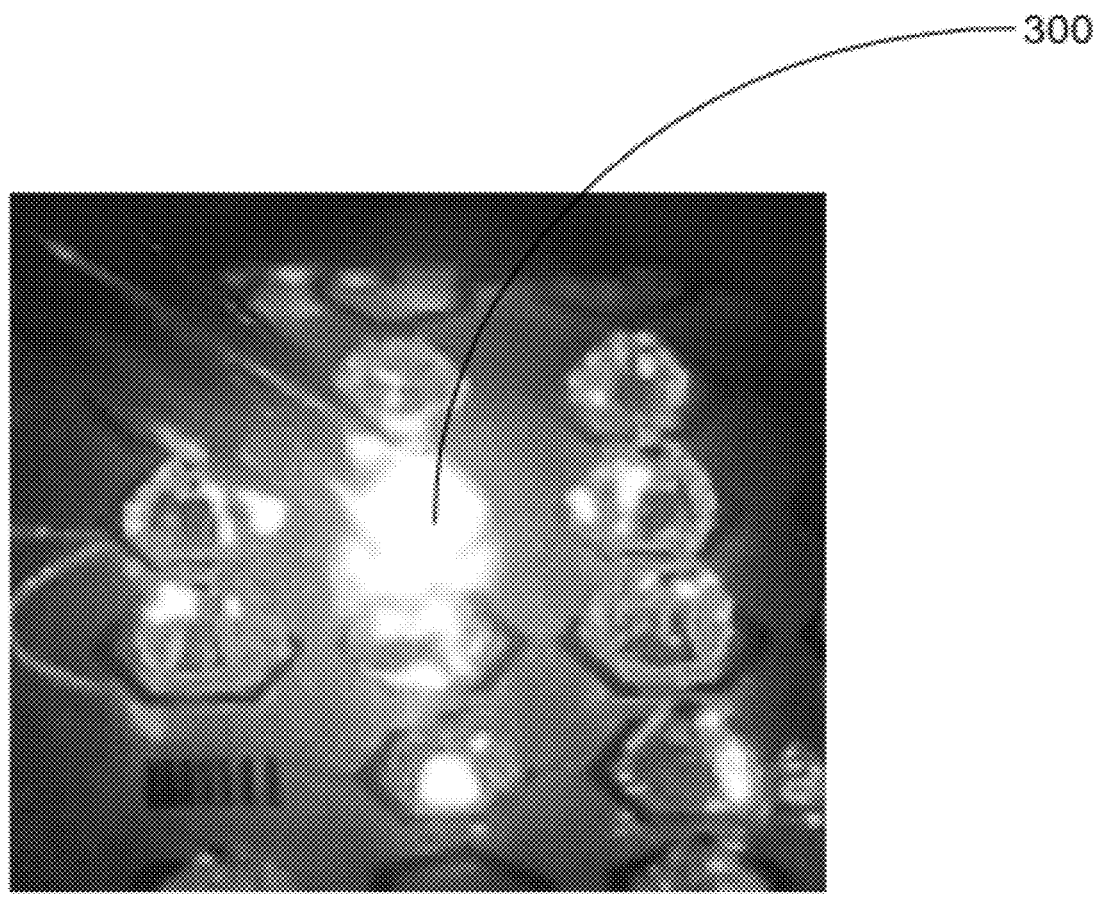
FIG. 3 is a photograph of a wafer bonded LED emitting light.

FIG. 3 is a photograph of the fabricated wafer-bonded LED, biased to pass 20 mA of current and from which light emitting is observed as extracted light (300).

Figure 4:
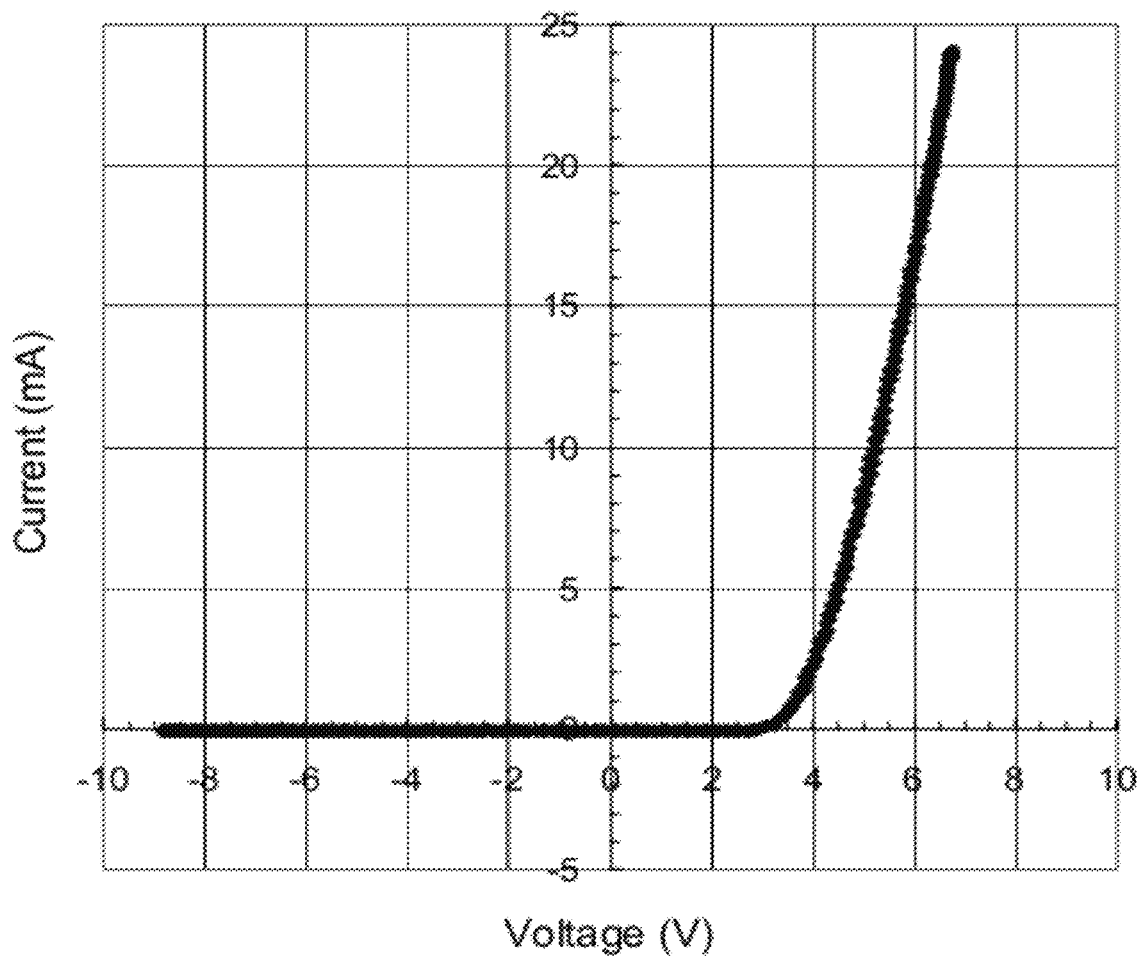
FIG. 4 is an electrical characteristic (Voltage-Current curve) of the wafer bonded LED.

FIG. 4 is a typical electrical characteristic (Voltage-Current curve) for the fabricated wafer-bonded LED.

The present invention comprises two steps for the direct wafer bonding of a (Al,Ga,In)N wafer, which may comprise a III-nitride optoelectronic device, and a ZnO wafer. The first step is preparing a flat and clean surface for both wafer surfaces to be bonded. For a ZnO substrate (e.g., 500 μm thick), the material is grown by a hydrothermal method [7]. After chemical-mechanical polishing and certain annealing processes, the ZnO wafer, which may be c-plane, is cleaned using several solvents, such as acetone and isopropyl alcohol.

(Al,Ga,In)N is grown using metal-organic chemical vapor deposition (MOCVD) on a suitable substrate, for example c-plane (0001) sapphire. After growth, the wafer is cleaned using several solvents, which is followed by oxide removal in HCl.

Figure 5:
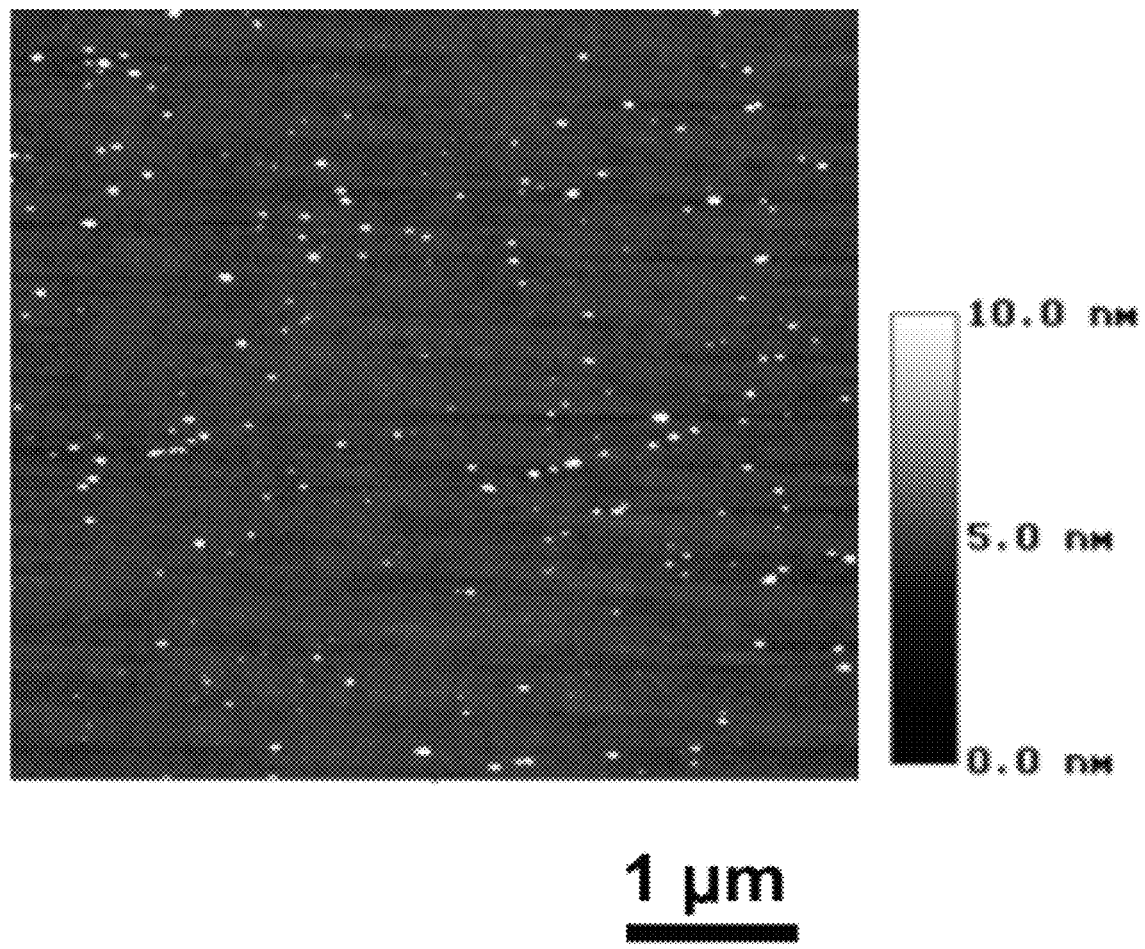
FIG. 5 is an atomic force microscope (AFM) image showing in color scale the surface roughness of the Zinc (Zn)-face of the ZnO wafer.
Figure 6:
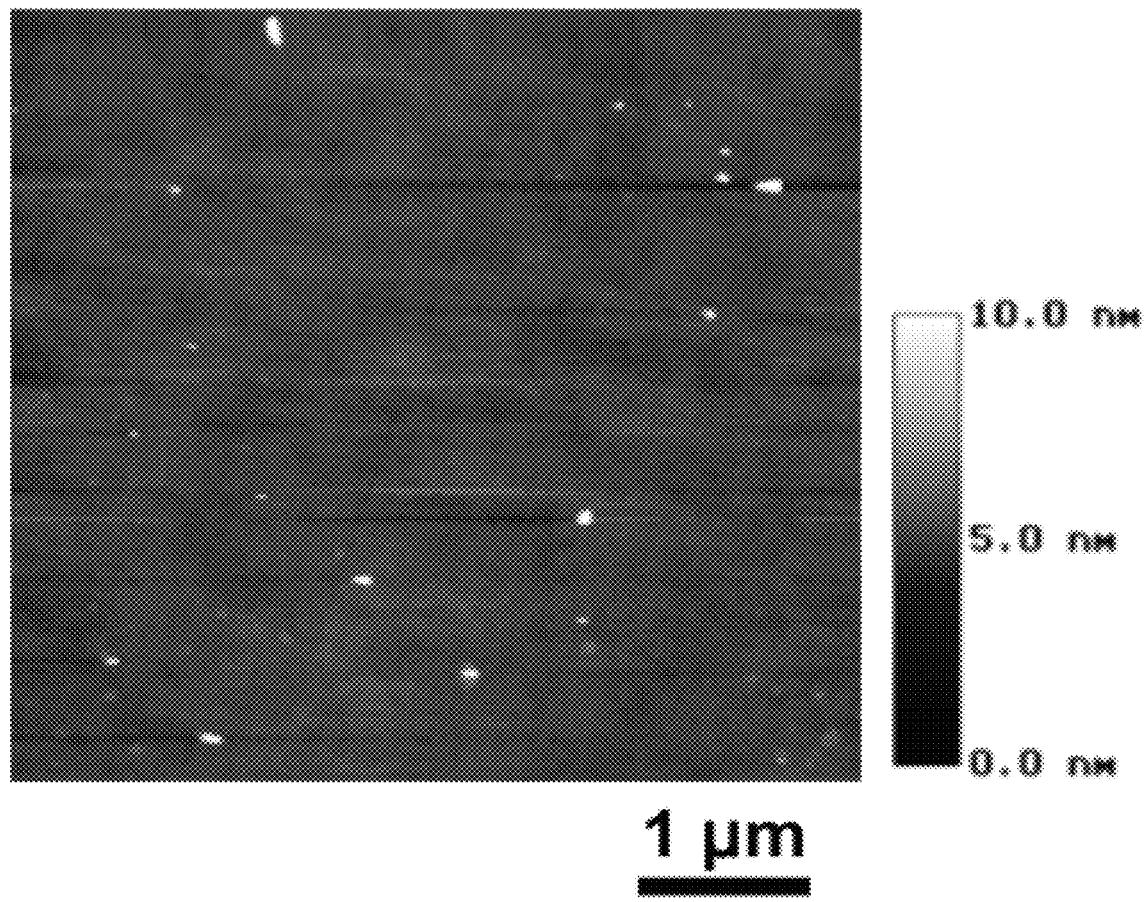
FIG. 6 is an atomic force microscope (AFM) image showing in color scale the surface roughness of the O-face of the ZnO wafer.

Surface morphologies of a c-plane ZnO substrate after cleaning using acetone and isopropyl alcohol are shown in FIG. 5 and FIG. 6, which are images obtained using an atomic force microscope (AFM).

FIG. 5 shows a color-scale map of the Zn-face surface after the first step, showing the surface roughness of the ZnO substrate, and FIG. 6 shows a color scale map of surface roughness of the O-face surface of the ZnO substrate after the first step. The observed root mean square (rms) roughness value is 0.75 nm and 0.51 nm, respectively. A flat surface for the ZnO or a transparent conductor comprises a rms roughness less than 1 nm.

Figure 7:
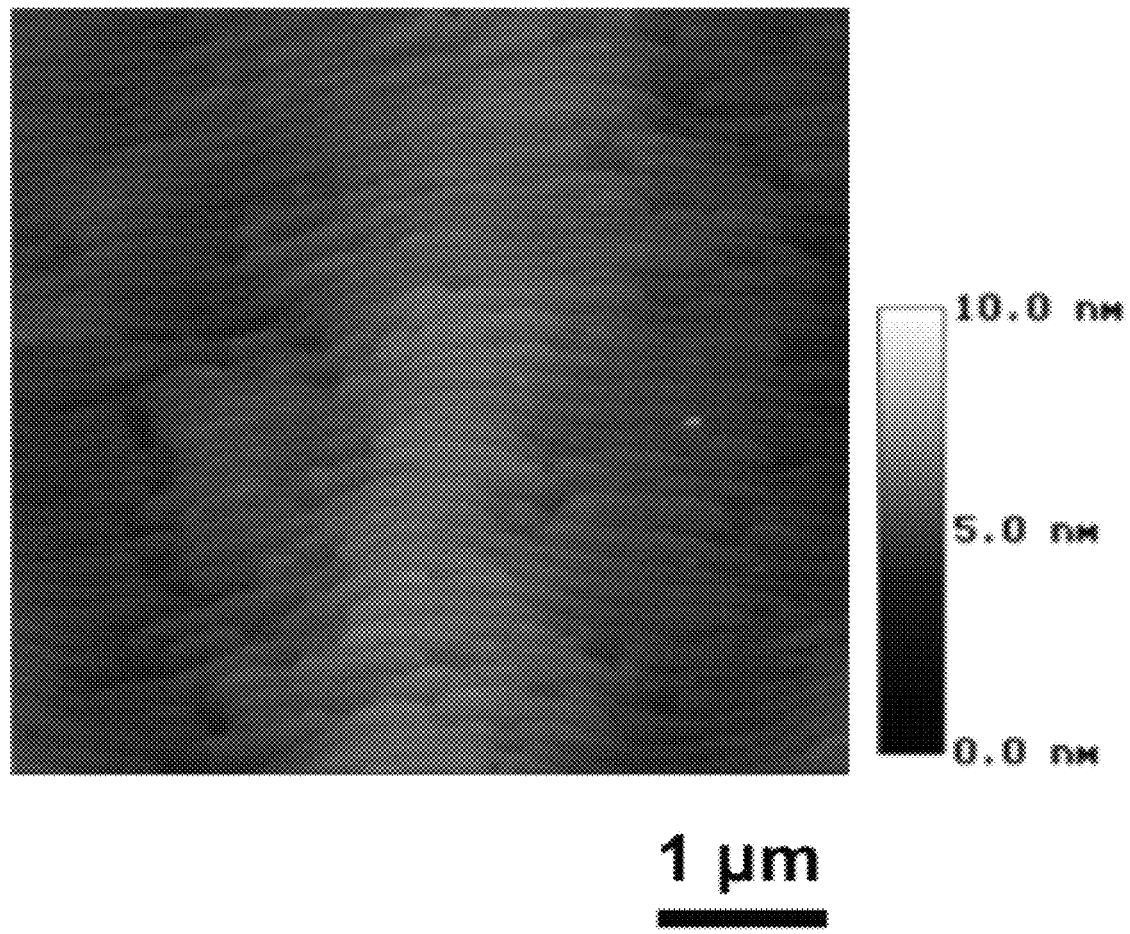
FIG. 7 is an atomic force microscope (AFM) image showing in color scale the surface roughness of the Gallium-face of a Gallium Nitride (GaN) wafer after solvent and HCl treatment.

FIG. 7 is an AFM image that shows the surface morphology of GaN as a color scale map after the first step comprising solvent and HCl treatment. The observed rms roughness is 0.55 nm. A flat surface for the III-nitride comprises a rms roughness less than 1 nm.

The second step is a direct wafer bonding process between the (Al,Ga,In)N and ZnO wafer. The two wafers are joined together and then wafer bonded in a nitrogen ambient under uniaxial pressure at a set temperature for a set duration.

Figure 8:
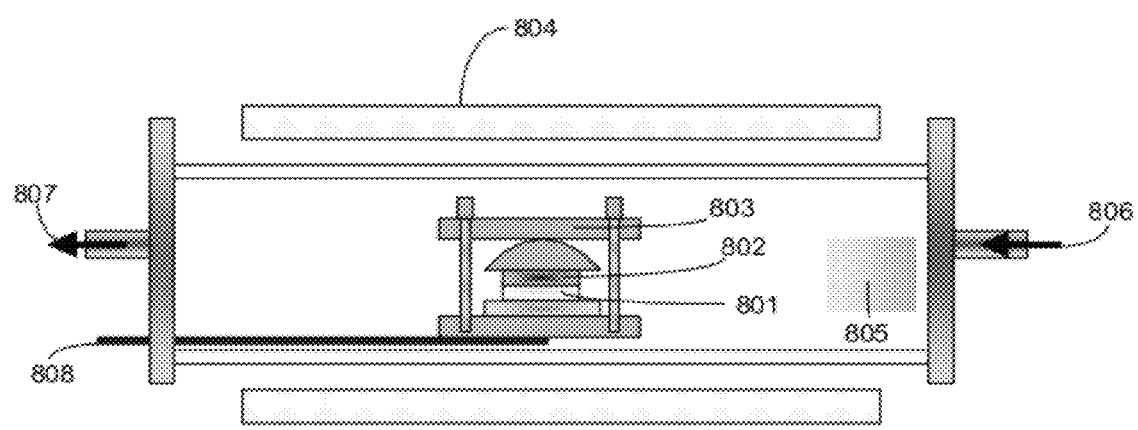
FIG. 8 illustrates how the ZnO wafer and GaN wafer are joined together under uniaxial pressure of 8 MPa using a graphite boat and screw configuration.

FIG. 8 illustrates how the ZnO wafer (801) and an (Al, In, Ga)N wafer (802) such as a GaN wafer are joined together under uniaxial pressure of 8 MPa using a graphite boat and screw configuration. The graphite boat and screw configuration comprises a carbon fixture (803). FIG. 8 also shows how the sample is then loaded into a wafer-bonding furnace (804), and the furnace (804) is heated to a temperature of 600° C. for 1 hour in an $N_2$ gas flow (805). The furnace comprises an input (806) and an output (807) for the $N_2$ gas flow and a thermocouple (808). After this thermal process, the two wafers are wafer bonded.

Figure 9:
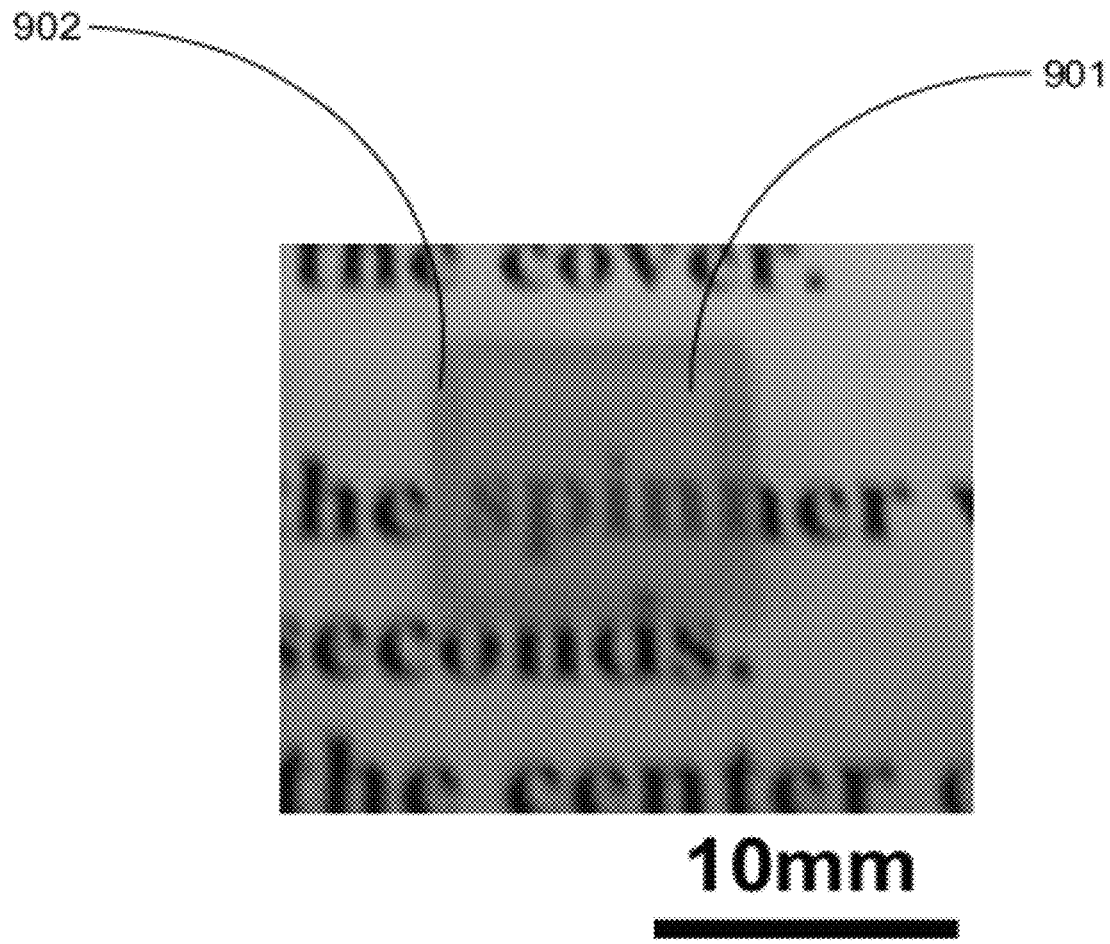
FIG. 9 is a photograph of a wafer bonded structure comprising a Zn-face ZnO wafer and a Ga-face GaN layer wafer bonded together. The GaN is the lower wafer and the ZnO is the upper wafer.
Figure 10:
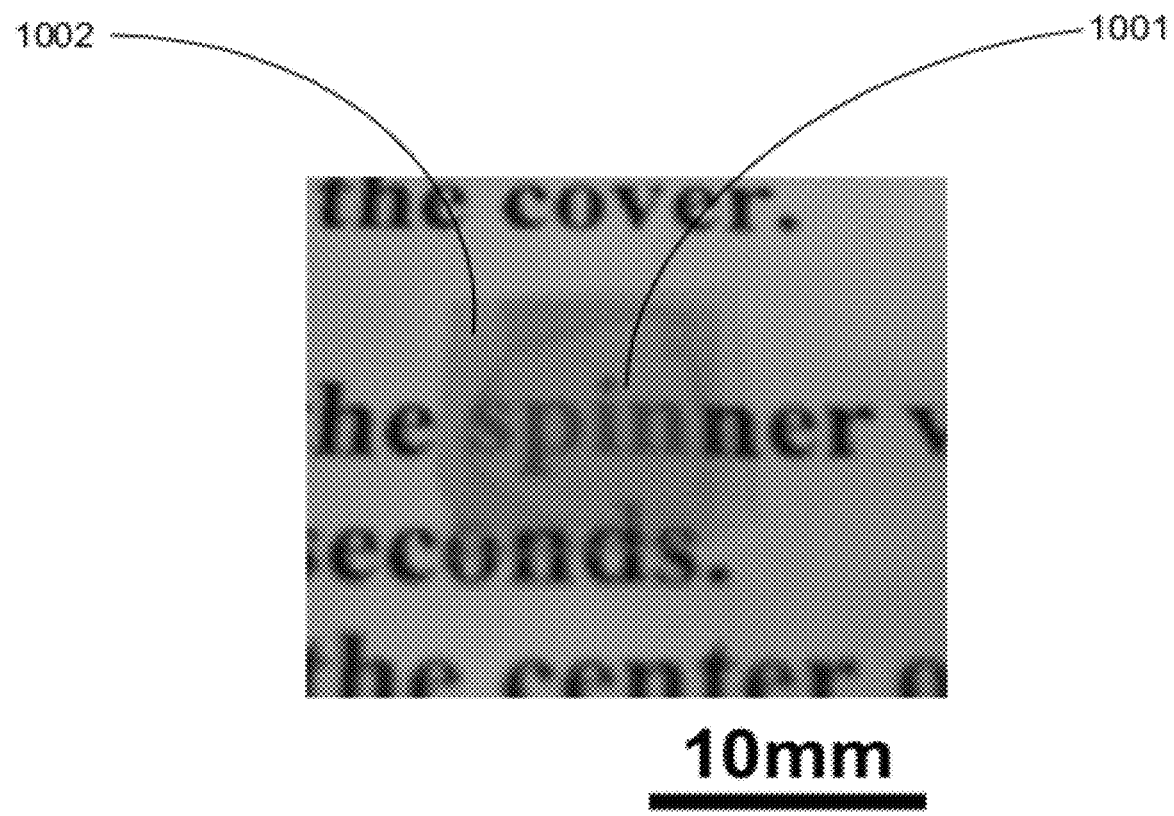
FIG. 10 is a photograph of a wafer bonded structure comprising an O-face ZnO wafer and a Ga-face GaN layer wafer bonded together. The GaN is the lower wafer and the ZnO is the upper wafer.

Photographs of wafer-bonded samples are shown in FIG. 9 and FIG. 10. In FIG. 9, the Zn face (901) of the ZnO is wafer bonded to the Ga face (902) of a GaN layer. In FIG. 10, the O-face (1001) of the ZnO is wafer bonded to the Ga face (1002) of a GaN layer. In both cases, transparency remains after the wafer bonding process. In FIG. 9 and FIG. 10, both wafers are same size. The upper wafer is ZnO and the wafer below is GaN.

After the direct wafer bonding, the O-faced ZnO substrate may be shaped into a truncated hexagonal pyramid using diluted HCl. A p-type electrode and n-type electrode are formed using electron beam evaporation method.

The integration of highly transparent ZnO material with GaN by direct wafer bonding is novel and has advantages over existing high-brightness LED (HB-LED) designs.

Other Device Structures

FIGS. 11, 12, 13, 14 show other examples of optical devices comprising (Al, Ga, In)N and ZnO direct wafer-bonded LEDs. With the use of highly transparent and surface feature shaped ZnO structures, the emitted light from the active region can be extracted efficiently. ZnO has a transmittance of more than 80% for wavelengths of more than 360 nm giving rise to a high extraction efficiency, and is electrically conductive. ZnO is an example of a transparent conductor.

In FIGS. 11 (a) and (b), each wafer bonded LED comprises a suitable substrate, for example a sapphire substrate (1100), an n-type III-nitride layer (1101), a III-nitride active region (1102), a p-type III-nitride layer (1103), an n-type ZnO layer (1104), at least one p-type electrode (1105) on the n-type ZnO layer (1104) and at least one n-type electrode (1106) on the n-type III-nitride (1101).

Figure 11A:
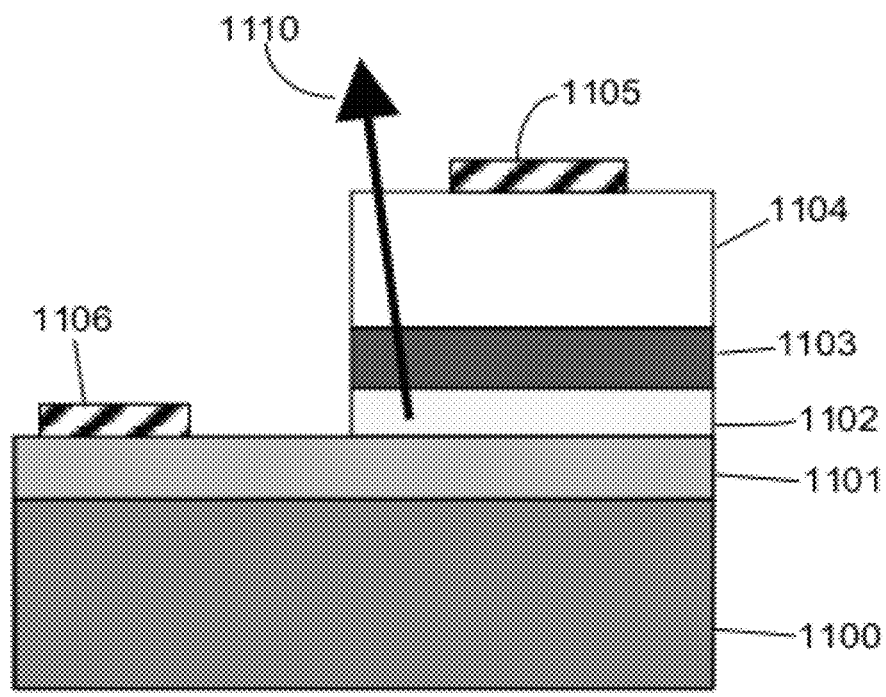
FIG. 11(a) shows a rectangular ZnO wafer and FIG. 11(b) shows a ZnO surface comprising inclined planar surfaces.

In the embodiment shown in FIG. 11(a), the n-type ZnO (1104) is wafer bonded to the LED at the p-type III-nitride layer (1103). FIG. 11 also illustrates a possible trajectory (1110) for extracted light from the LED.

Figure 11B:
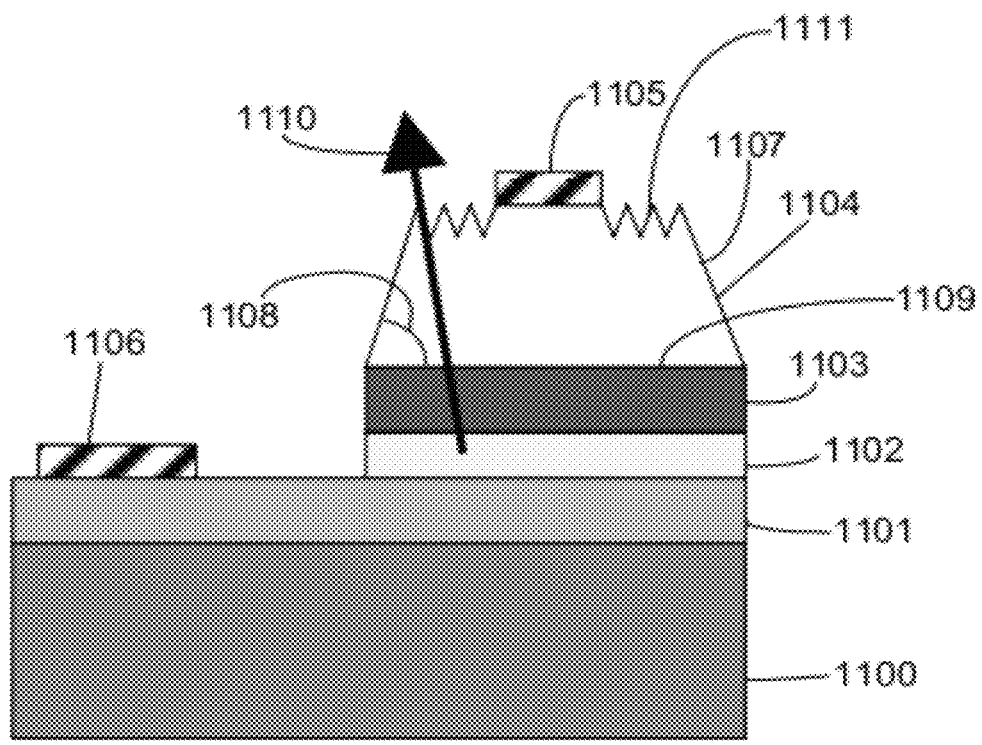

In the embodiment shown in FIG. 11(b), the n-type ZnO (1104) comprises one or more inclined planar surfaces (1107) inclined at a critical angle (1108) relative to the interface (1109) between the III-nitride optoelectronic device and the ZnO layer (1104). FIG. 11(b) shows that the ZnO layer surface (1111) may be shaped into truncated hexagonal pyramids or by adequate roughening.

The n-type ZnO (1104) has a refractive index (~2.1) lower than the refractive index of the underlying III-nitride, in this case a p-type III-nitride layer (1103), and the critical angle (1108) is determined by the transparent conductor refractive index divided by the III-nitride refractive index. For example, if the underlying III-nitride is GaN having a refractive index of ~2.3 and the transparent conductor is n-type ZnO having a refractive index of ~2.1, the critical angle (1108) is ~66°. Thus, total internal reflection is suppressed leading to increased light extraction. The transparent conductor has a refractive index lower than the adjacent III-nitride, which is typically a p-type or n-type layer. Tolerances for critical angles may be within a range of 10% of the calculated value.

FIGS. 12 (a) and (b) show further wafer bonded LED embodiments comprising an n-type III-nitride layer (1201), a III-nitride active region (1202), a p-type III-nitride layer (1203), an n-type ZnO layer (1204), at least one p-type electrode (1205) and at least one n-type electrode (1206). In these embodiments the suitable substrate comprising sapphire has been removed.

Figure 12A:
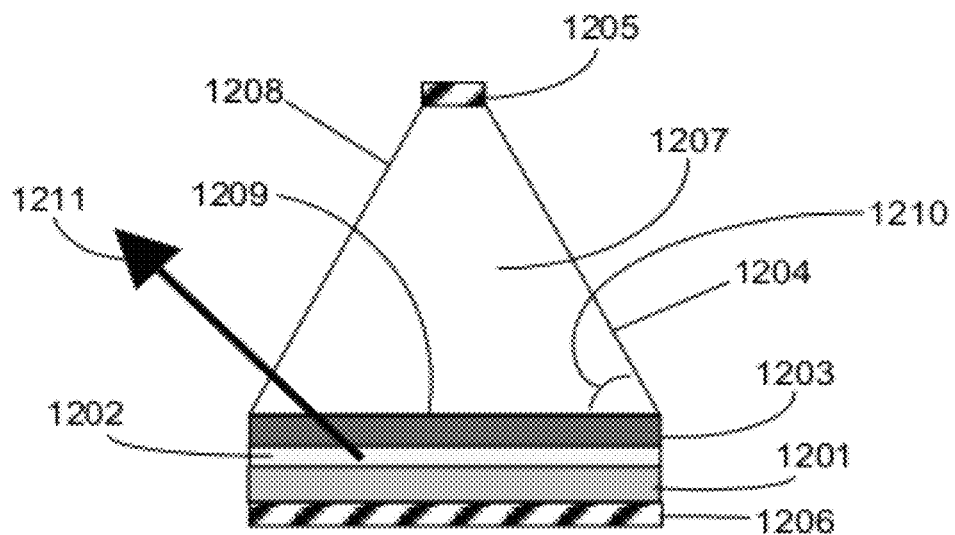
FIG. 12(a) shows a ZnO surface comprising a truncated hexagonal pyramid shape.

In the embodiment illustrated in FIG. 12(a), the n-type ZnO (1204) is shaped into at least one truncated hexagonal pyramid or cone (1207). The at least one truncated pyramid or cone comprises inclined planar surfaces (1208) that are inclined relative to the interface (1209) between the III-nitride optoelectronic device and the n-type ZnO (1204) at a critical angle (1210). The inclined planar surfaces (1208) may comprise an {1 0-1 1} orientation.

Figure 12B:
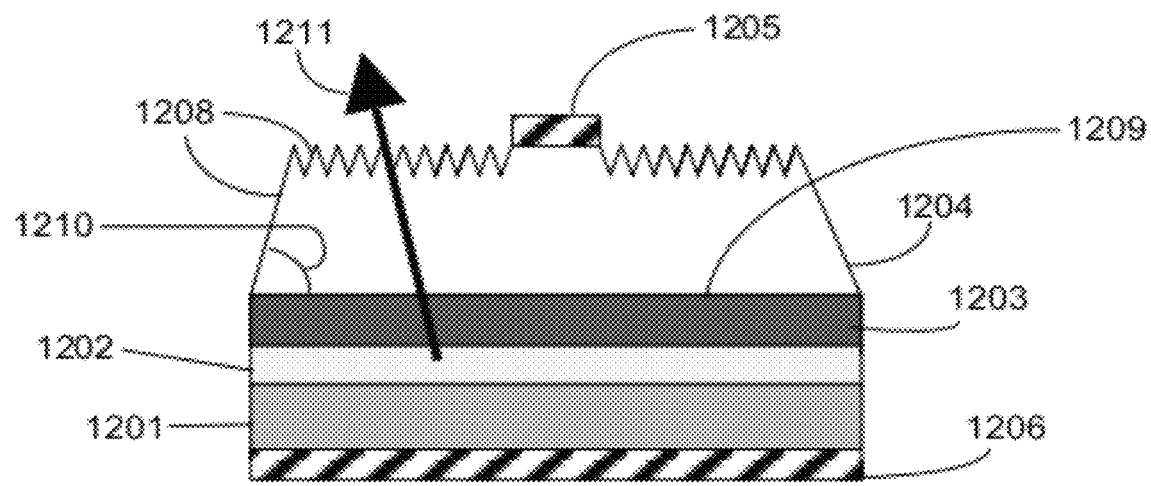
FIG. 12(b) shows a ZnO surface comprising inclined planar surfaces.

In the embodiment illustrated in FIG. 12(b), the n-type ZnO (1204) comprises inclined planar surfaces (1208) inclined relative to the interface (1209) at a critical angle (1210). The arrow (1211) shows a possible trajectory for extracted light.

Figures 13A, 13B:
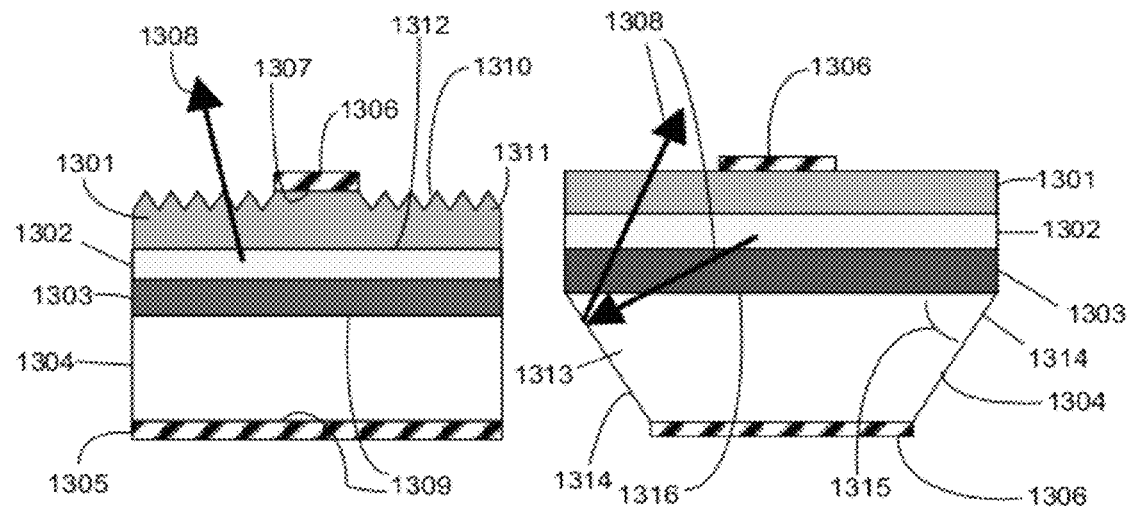
FIG. 13(a) shows a ZnO wafer with a rectangular shape.
FIG. 13(b) shows a ZnO wafer comprising inclined sides.
Figure 13C:
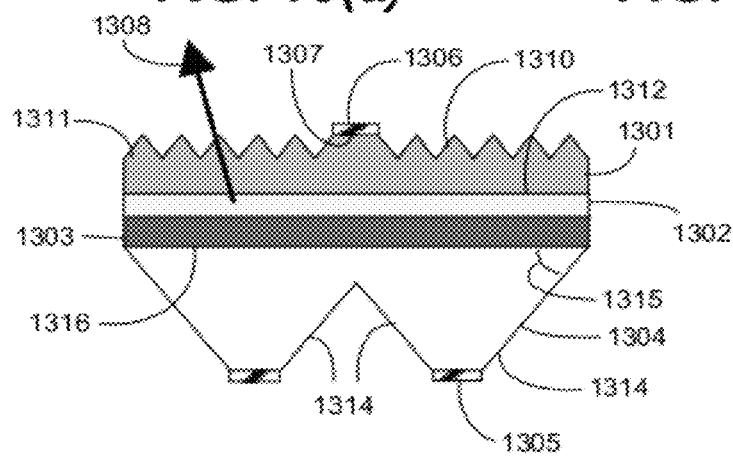
FIG. 13(c) shows a ZnO wafer surface comprising two truncated pyramids.

FIG. 13 illustrates the ZnO located at the bottom side of the III-nitride optoelectronic device and comprising different shapes or polyhedrons. FIGS. 13 (a), (b) and (c) illustrate LEDs comprising n-type III-nitride (1301), an active region (1302), and p-type III-nitride (1303) direct wafer bonded to n-type ZnO (1304). The wafer bonded structure further comprises a p-type electrode (1305) deposited or bonded on n-type ZnO (1304) and an n-type electrode (1306) deposited on the N face (1307) of n-type III-nitride (1301). Alternatively, the n-type electrode (1306) may be formed on the Ga face. Also, the N-face (1307) of the LED (in this case on the n-type III-nitride) can be shaped or roughened for improving light extraction [8], as shown in FIGS. 13(a) and 13(c). The arrow (1308) illustrates a possible trajectory for extracted light.

In the embodiment shown in FIG. 13(a), the n-type ZnO has substantially parallel planar surfaces (1309). In addition, the n-type III-nitride (1301) comprises inclined planar surfaces (1310) inclined at a critical angle (1311) relative to the interface (1312) between the n-type III-nitride (1301) and active region (1302).

In the embodiment shown in FIG. 13(b), the n-type ZnO (1304) has been shaped or roughened to comprise a polyhedron (1313) with inclined planar surfaces (1314) inclined at a critical angle (1315) relative to the interface (1316) between the ZnO (1304) and the III-nitride optoelectronic device or LED.

In the embodiment shown in FIG. 13(c), the n-type ZnO (1304) comprises inclined planar surfaces (1314) and the n-type III-nitride (1301) comprises inclined planar surfaces (1310).

Figure 14:
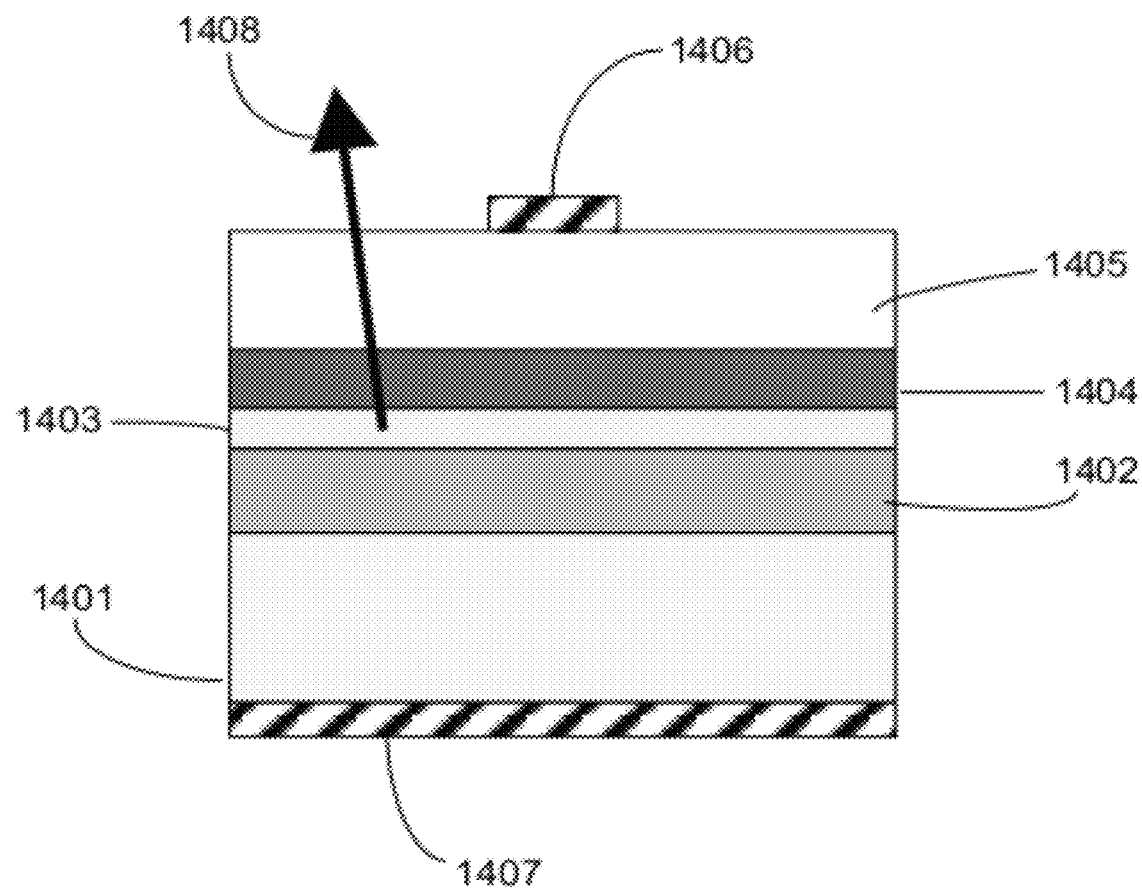
FIG. 14 is a schematic cross-section of a wafer-bonded LED comprising a silicon carbide (SiC) substrate or GaN substrate.

The optical device illustrated in FIG. 14 comprises a suitable substrate (1401) which may comprise an electrically conductive and transparent substrate such as Silicon Carbide (SiC) or Gallium Nitride (GaN), an n-type III-nitride layer (1402), an active region (1403), p-type III-nitride (1404), n-type ZnO (1405), a p-type electrode (1406) and an n-type electrode (1407). Light may be extracted from the LED as shown by the arrow (1408).

Figure 15:
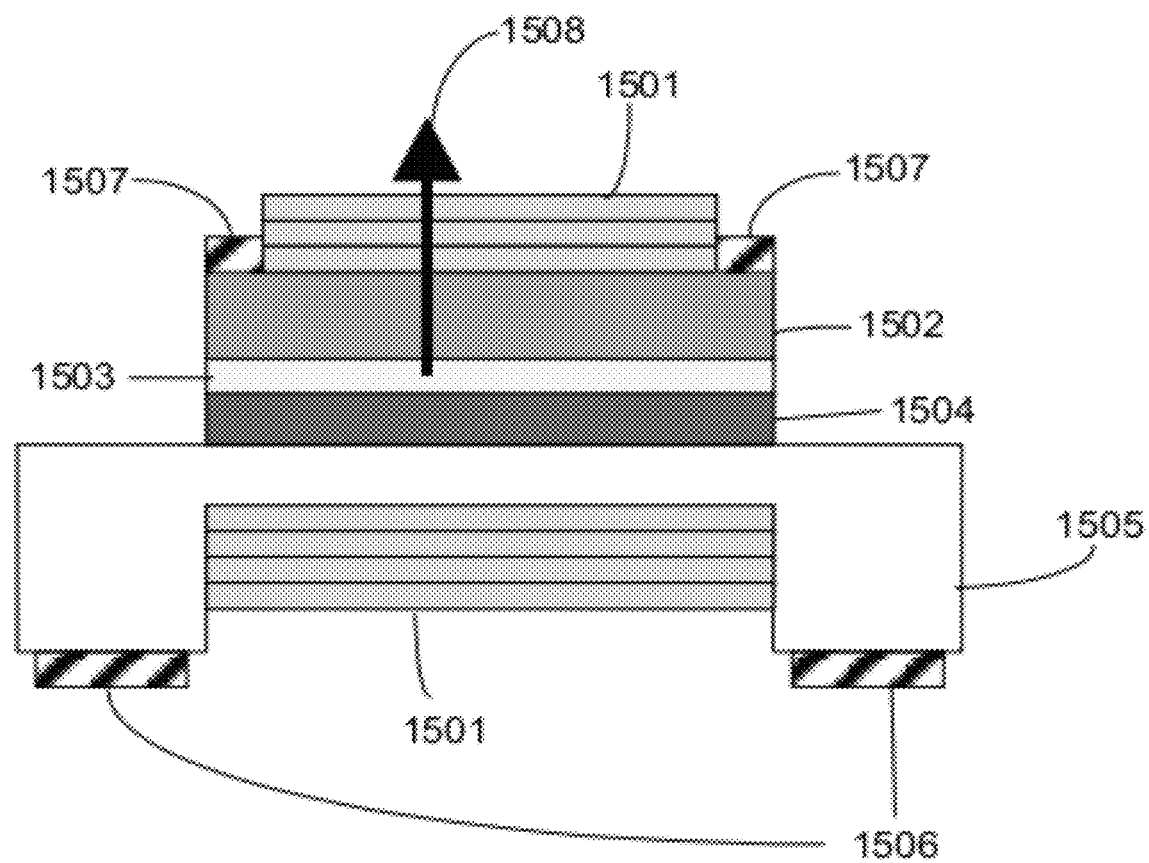
FIG. 15 is a schematic cross-section of a wafer-bonded vertical cavity surface emitting laser (VCSEL).

FIG. 15 is a schematic cross-section of an optical device comprising a wafer-bonded vertical cavity surface emitting laser (VCSEL). The VCSEL comprises two Distributed Bragg Reflectors (1501) comprised of silicon dioxide and tantalum oxide ($SiO_2/Ta_2O_5$), an n-type III-nitride layer (1502), an active region (1503), p-type III-nitride (1504) which has been wafer bonded to n-type ZnO (1505). The optical device further comprises at least one p-type electrode (1506) and at least one n-type electrode (1507). The VCSEL may enable current spreading from p-type electrode (1506) to p-type III-nitride (1504). The arrow (1508) illustrates the direction of laser emission.

Figure 16:
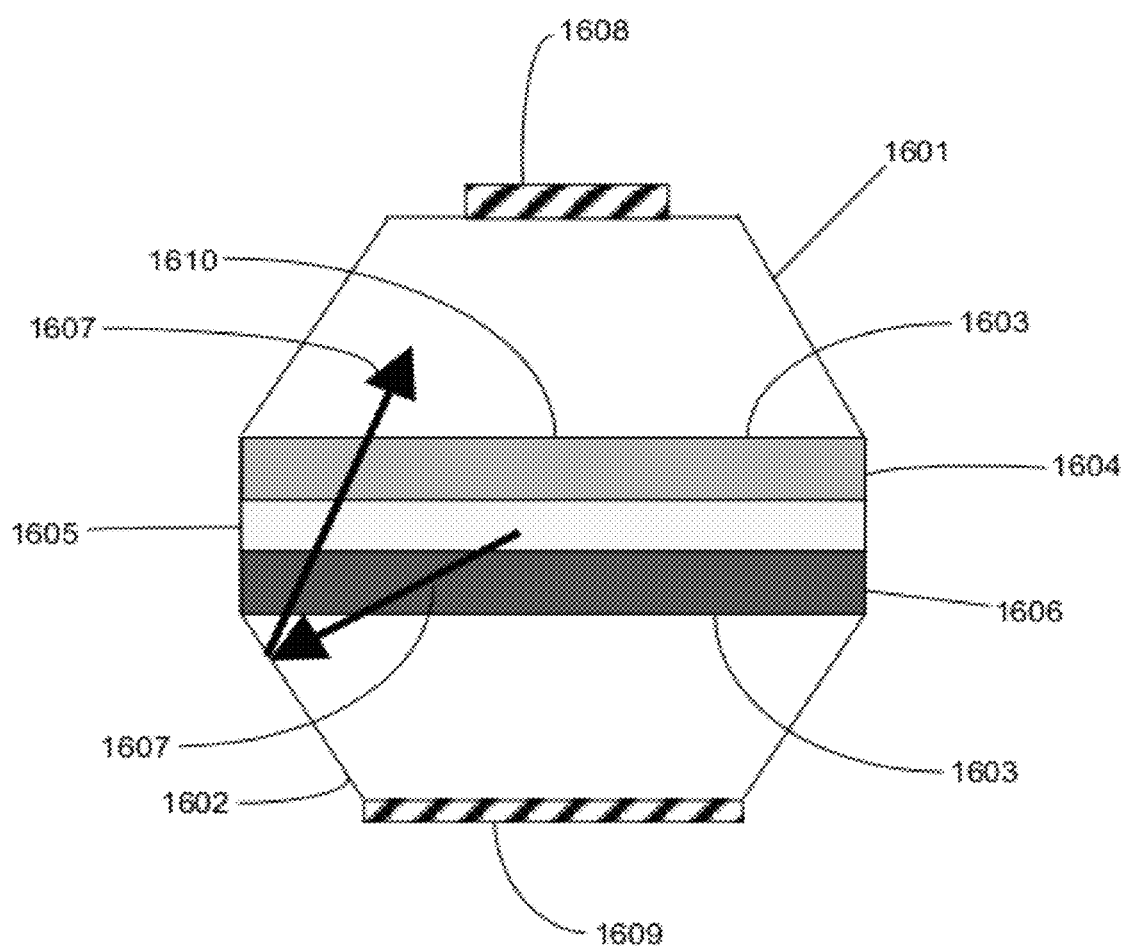
FIG. 16 is a schematic cross-section of a wafer-bonded LED comprising ZnO or a transparent conductor bonded on both sides of the device.

FIG. 16 shows a schematic cross-section of one or more transparent conductor layers comprising ZnO (1601), (1602) direct wafer bonded on both sides (1603) of an III-nitride optical device, in this case an LED.

The LED comprises an n-type III-nitride layer (1604), an active region (1605) and p-type III-nitride (1606). The p-type ZnO layer (1601) and n-type ZnO layer (1602) are wafer bonded to the n type III-nitride (1604) and p-type III-nitride (1606) respectively. FIG. 16 also illustrates possible trajectories (1607) for light being extracted from the device. At least one n-type electrode (1608) and at least one p-type electrode (1609) may be deposited on the top of the transparent conductor layers (1601), (1602).

Throughout these figures, the one or more transparent conductor layers may also comprise Indium Tin Oxide (ITO), Zinc Selenide (ZnS) or Zinc Telluride (ZnTe), Gallium Oxide, and Indium Gallium Zinc Oxide instead of ZnO. The transparent conductor layers should be electrically conductive and have a transmittance of more than 60% for wavelengths of operation for the III-nitride optoelectronic device. The highly transparent characteristic reduces light absorption inside a LED. The electrically conductive characteristic enables uniform light emitting from the active region in a LED. Shaped or roughened transparent conductor layers reduces light reflections occurring repeatedly inside a LED, and thus extracts more light out of the LED.

Figure 17:
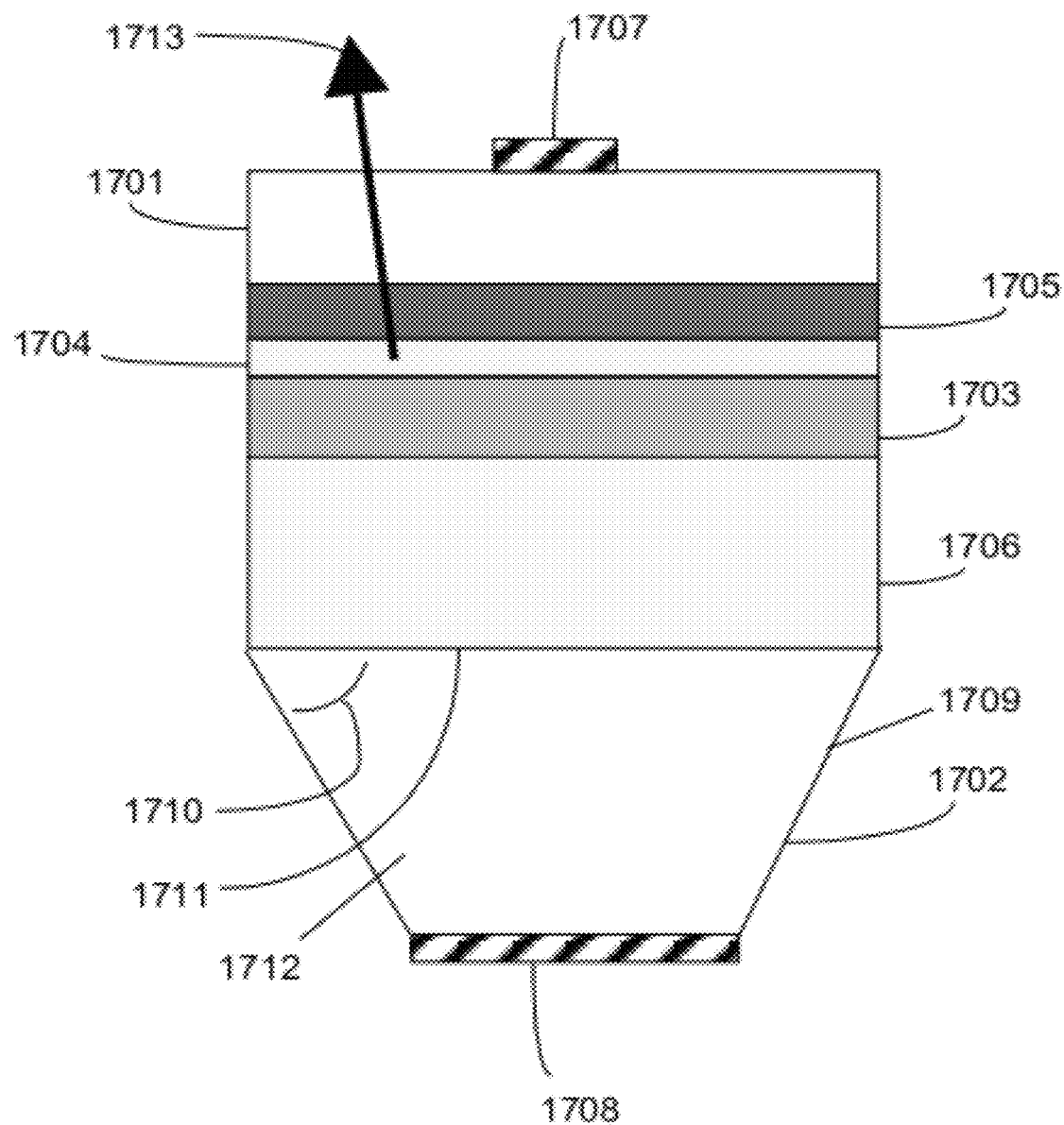
FIG. 17 is a schematic cross-section of a wafer-bonded LED comprising ZnO or a transparent conductor (ITO) bonded on both sides of the device.

FIG. 17 is a schematic cross-section of a wafer-bonded LED showing how one or more transparent conductor layers comprising ITO (1701) and (1702) may be bonded on both sides of the III-nitride optical device. The III-nitride optical device comprises n-type III-nitride (1703), an active region (1704), p-type III-nitride (1705) and a suitable substrate comprising silicon carbide or gallium nitride (1706). One or more n-type transparent conductor layers (1701) and one or more p-type transparent conductor layers (1702) are bonded on the p-type III-nitride (1705) and the suitable substrate (1706) respectively. The wafer bonded LED further comprises at least one p-type electrode (1707) and at least one n-type electrode (1708).

FIG. 17 also shows how the one or more transparent conductor layers may be shaped or roughened. The shaped one or more transparent conductor layers may comprise one or more inclined planar surfaces (1709) of the one or more transparent conductor layers (1701), (1702) inclined at a critical angle (1710) that is relative to an interface (1711) forming, for example, at least one truncated hexagonal pyramid (1712) with at least one electrode (1708) on top. The arrow (1713) illustrates a possible trajectory for extracted light.

Figure 18:
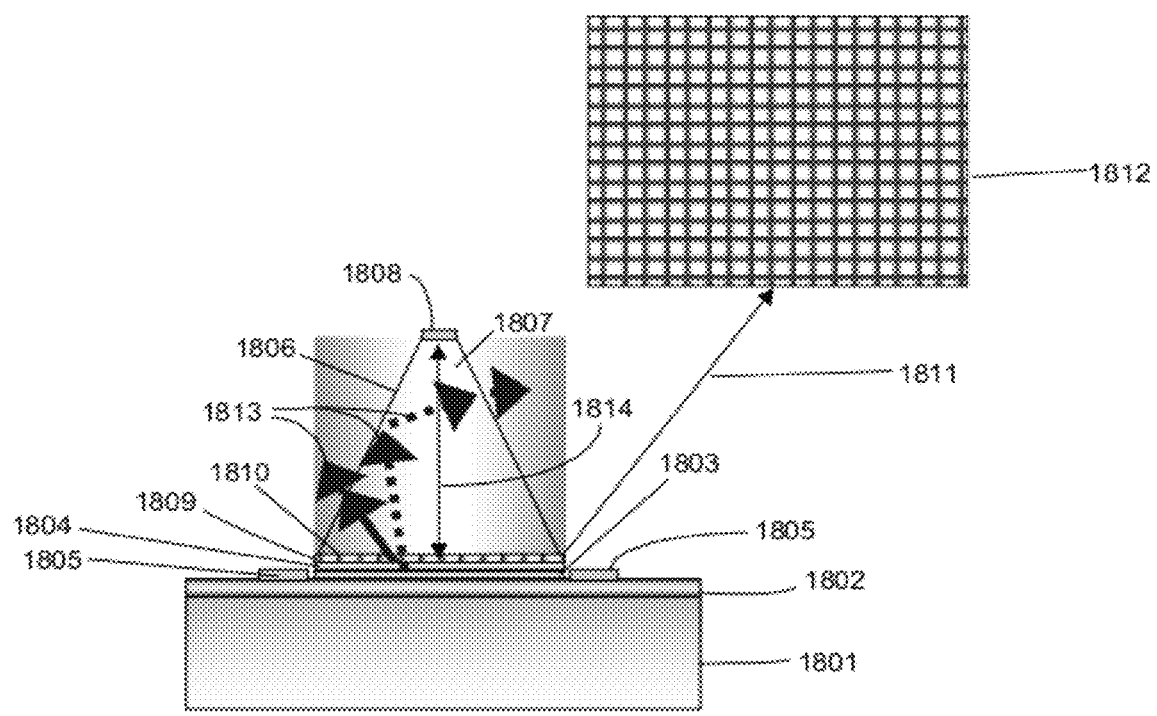
FIG. 18 shows a schematic representation of a high light extraction efficiency LED according to the preferred embodiment of the present invention.

FIG. 18 shows a schematic representation of high light extraction efficiency LED according to the preferred embodiment of the present invention. Generally, the LED is an (Al, Ga, In)N and ZnO direct wafer-bonded LED structure.

In this example, one or more III-nitride LEDs are deposited on a suitable substrate (1801) such as a sapphire substrate, wherein the III-nitride LED comprises an n-type layer (1802) such as n-GaN, an active layer (1803), and a p-type layer (1804) such as p-GaN. One or more n-type electrodes (1805) may reside on the n-type layer (1802). One or more n-type ZnO layers (1806), which may be shaped, are wafer-bonded to the LED. The ZnO (1806) may be shaped into a cone (1807), with a p-type electrode (1808) on the truncated top of the n-type ZnO cone (1807).

At least one intermediate contact layer (1809) comprised of a thin metal or oxidized metal, such as Pt, Al, Ni, Au, Ti, Ni oxide, or Ga oxide, may be placed between the III-nitride optical device comprising (Al, Ga, In)N and ZnO wafers before bonding, wherein the thin metal or oxidized metal enables less electrical resistance at the wafer bonded interface (1810).

In FIG. 18, the intermediate contact layer (1809) comprises an interdigitated contact layer that is deposited on the p-type layer (1804) prior to the wafers being bonded. In an alternative embodiment, the intermediate contact layer may be deposited on an n-type layer. In the FIG. 18, an arrow (1811) points to a top view (1812) of the geometry of the contact layer. The arrows (1813) illustrate possible trajectories for light emitted from the device. The arrow (1814) represents the height of the cone (1807).

In this embodiment, the interdigitated contact layer (1809) is patterned as a lattice, so that interstitial gaps in the layer pass light through from the III-nitride optoelectronic device comprising an LED. Note that the contact layer may comprise any number of different patterns, such as fingers, cross-bars, hatched or matrix patterns. Moreover, the material of the contact layer may be transparent or translucent.

Figure 19:
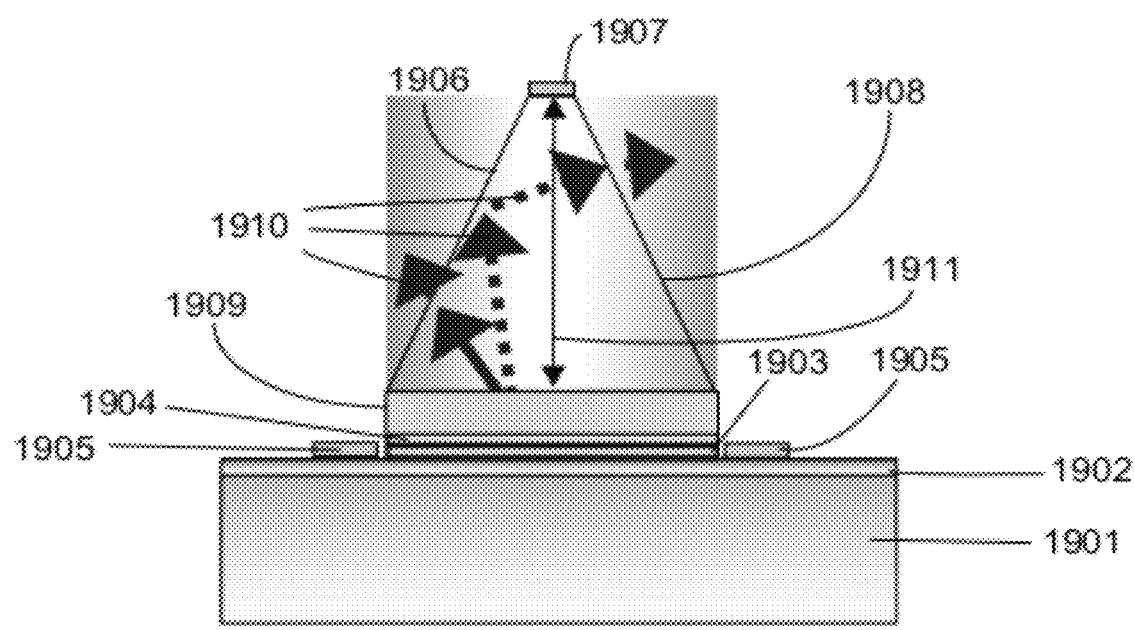
FIG. 19 shows a schematic representation of a high light extraction efficiency LED according to the preferred embodiment of the present invention.

FIG. 19 shows a schematic representation of a high light extraction efficiency LED according to an embodiment of the present invention. This device is similar to the device shown in FIG. 18, comprising an LED on a suitable substrate (1901) such as a sapphire substrate, wherein the III-nitride LED comprises an n-type layer (1902) such as n-GaN, an active layer (1903), and a p-type layer (1904) such as p-GaN. One or more n-type electrodes (1905) may reside on the n-type layer (1902). One or more n-type ZnO layers (1906) are wafer-bonded to the LED, with a p-type electrode (1907) on top of the n-type ZnO (1906) which may be shaped, for example into a cone (1908).

However, in FIG. 19 the intermediate contact layer (1909) comprises a bulk contact layer comprised of Nickel Oxide and Gold (NiO/Au). The bulk contact layer may comprise a thickness<200 Å. The arrows (1910) illustrate possible trajectories for extracted light and the arrow (1911) represents the height of the cone (1908). The transparent conductor comprising ZnO has a transmittance of more than 80% for wavelengths of more than 360 nm giving rise to a high extraction efficiency.

Process Steps

Figure 20:
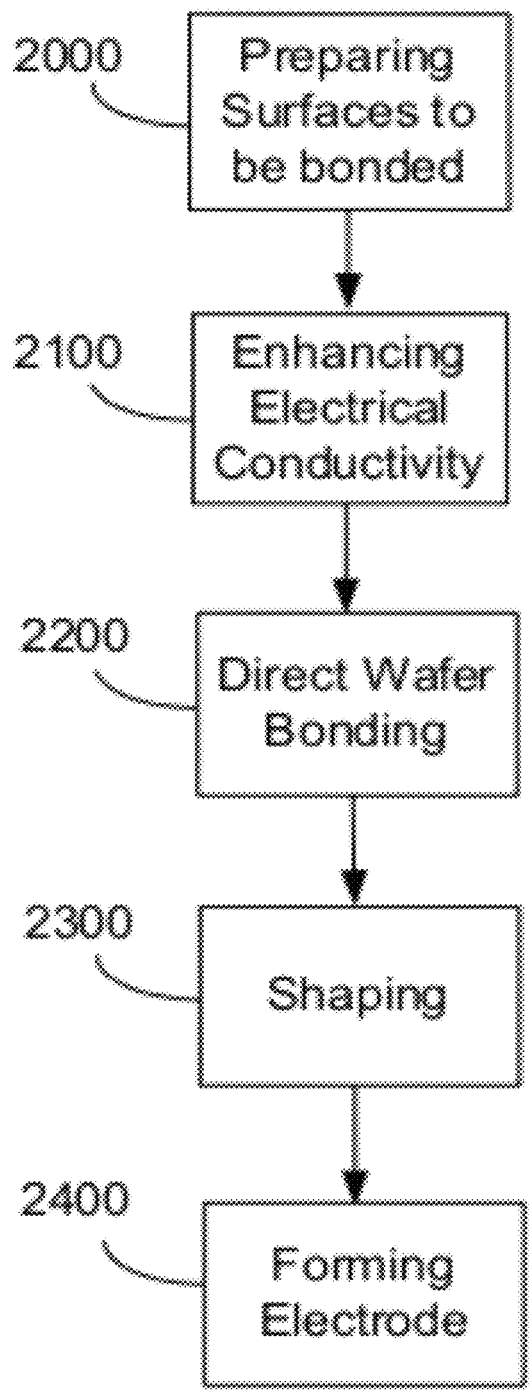
FIG. 20 represents a method for producing a direct wafer bonded optical device, wherein light passes through one or more transparent conductor layers.

FIG. 20 represents a method for producing a direct wafer bonded optical device, wherein light passes through one or more transparent conductor layers.

Block 2000 represents the step of preparing flat and clean surfaces of one or more transparent conductor layers and a III-nitride optical device to be bonded. The III-nitride optical device may be grown on a suitable substrate. The transparent conductor layers may comprise Zn(O,Se,Te), Indium Tin Oxide, Gallium Oxide, Indium Gallium Zinc Oxide, $In_2O_3$/$SnO_2$ (Indium Tin Oxide, ITO). The one or more transparent conductor layers' surfaces to be bonded may comprise the Zn-face of c-plane ZnO. The transparent conductor layers surfaces to be bonded may comprise the O-face of c-plane ZnO. The III-nitride optoelectronic device surface may be partially shaped prior to the wafer bonding process, and thus enables a strong wafer bonded interface.

Block 2100 represents the step of enhancing electrical conductivity of a wafer bonded interface prior to direct wafer bonding. The one or more transparent conductor layers surface may be plasma treated prior to the wafer bonding process to enhance electrical conductivity at the wafer bonded interface.

Block 2200 represents the step of performing a direct wafer bonding process between the one or more transparent conductor layers and the III-nitride optical device. The III-nitride optoelectronic device and one or more transparent conductor layers may be joined together and then wafer bonded in a nitrogen ambient under uniaxial pressure at a set temperature for a set duration. The III-nitride optoelectronic device and the one or more transparent conductor layers may be loaded into a wafer-bonding furnace, and the furnace heated to a temperature of 600° C. for 1 hour in an $N_2$ gas flow.

Block 2300 represents the step of roughening or shaping the surface of the one or more transparent conductor layers by, for example anisotropic etching, after or before the wafer bonding process. The surface which is shaped may comprise an O-face of the ZnO. The anisotropic etching may comprise a chemical etching. The ZnO may be etched using HCl or diluted HCl. This step may be performed before the wafer bonding process.

Block 2400 represents the step of forming a p-type or n-type electrode.

Steps may be omitted or added as desired. In addition, steps may be performed in a different order. An optical device may be fabricated using the method.

Possible Modifications and Variations

The crucial aspects of direct wafer bonding between (Al, Ga, In)N and ZnO are the surface flatness and cleanliness. A variety of surface treatment techniques including polishing, plasma treatment may be employed to prepare an ideal surface for wafer bonding. Sufficient control of the crystal growth is also required in order to achieve a planar surface. Also, improvements in attaining a planar (Al, Ga, In)N surface using polishing or epitaxial growth techniques will result in more uniform wafer bonding.

Before the wafer bonding process, the (Al, Ga, In)N surface can be partially shaped to form micro-channels for the purpose of getting a strong wafer bonding interface.

Electrical conductivity at the top surface of the ZnO can be changed to higher than a bulk region by methods such as highly Ga or Al doped epitaxial layer growth, ion implantation, dopant diffusion, chemical surface treatment, and plasma treatment including hydrogen plasma and argon plasma use. Polarization-induced or bandgap engineered reduction of interface barrier heights can be also useful for obtaining less electrical resistance at a wafer bonded interface.

Insertion of very thin metal of platinum (Pt) or aluminum (Al) or nickel (Ni) or titanium (Ti) or oxidized metal (Ni oxide or Ga oxide) is also possible to enhance the electrical conductivity of the wafer-bonded interface of ZnO and (Al, Ga, In)N.

Concerning the growth method for ZnO, other techniques such as metalorganic chemical vapor deposition (MOCVD) or molecular beam epitaxy (MBE) may also be used for additional layer formation.

Concerning the growth of the (Al, Ga, In)N layer, these layers may be grown by MOCVD or MBE on a variety of suitable substrates, particularly SiC, Si, GaN, ZnO or AlN. The III-nitride can have any orientation, for example c-plane.

Concerning surface treatments and bonding conditions, HF can also be used for (Al, Ga, In)N layer treatment. Plasma treatment can be used for enhancing the wafer-bonding process. Other gases such as $H_2$ can also be used for an atmosphere during the wafer bonding process. The wafer bonding process can be done under vacuum condition. Of course, temperature and uniaxial pressure setting during the wafer bonding process can be changed.

For ZnO surface feature shaping, a wet etching method, dry etching method, and chipping method can also be used.

Other possibilities of direct wafer bonding are between (Al, Ga, In)N and Zn(S, Te), between (Al, Ga, In)N and $SnO_2$, and between (Al, Ga, In)N and $In_2O_3/SnO_2$ (Indium Tin Oxide, ITO). The ZnO may be polar or non-polar.

In addition to LEDs, the present invention could also be applied to bonding (Al, Ga, In)N and ZnO wafers for other optical device applications such as photodetector applications, photodiodes, phototransistors, solar cells, etc.

Advantages and Improvements

This method for bonding (Al, Ga, In)N and ZnO wafers is novel and has advantages over existing device designs, especially for light emitting diode (LED) applications. The highly transparent characteristic of ZnO reduces light absorption inside a LED. The electrically conductive characteristic of ZnO enables uniform light emitting from the active region in a LED. Shaped or roughened ZnO reduces light reflections occurring repeatedly inside a LED, and thus extract more light out of the LED. The resulting external quantum efficiency of this new hybrid GaN/ZnO design should be higher than that of existing GaN-based devices.

The combination of a transparent ZnO electrode with a nitride LED grown on electrically conductive substrates, such as SiC, GaN can reduce the number of process steps required for the fabrication of LEDs, because an electrode can be easily formed on the electrically conductive material.

As for material stability for the purpose of optoelectronic device application, ZnMgSSe-based laser diodes (LDs) can be degraded due to point defects. The reliability of ZnMgSSe-based LDs can be established by slowing down this gradual degradation through reducing defects [9]. ZnO does not have this problem.

The bonding strength between Zn and O is stronger compared to that between Zn and Se. Table 1 illustrates the electron affinity of several materials [10], and the electron affinity of ZnO is larger than the others indicating material stability of ZnO.

TABLE 1

| Material | Electron Affinity (eV) |
|---|---|
| ZnO | 4.35 |
| ZnS | 3.9 |
| ZnSe | 3.67 |
| ZnTe | 3.53 |

In addition, thermal conductivity of ZnO is about 2 times higher than sapphire, so heat dissipation can also be enhanced by using ZnO as substrate instead of conventional sapphire. Table 2 illustrates the thermal conductivity of several materials [11].

TABLE 2

| Material | Thermal Conductivity ($Wcm^{-1}K^{-1}$) |
|---|---|
| ZnO | 0.6 |
| $Al_2O_3$ (sapphire) | 0.3 |
| GaN | 1.3 |
| SiC | 3.6 |

REFERENCES

The following references are incorporated by reference herein:
1. Appl. Phys. Lett. 56, 737-39 (1990).
2. Appl. Phys. Lett. 64, 2839-41 (1994).
3. Appl. Phys. Lett. 81, 3152-54 (2002).
4. Jpn. J. Appl. Phys. 43, L1275-77 (2004).
5. Jpn. J. Appl. Phys. 34, L797-99 (1995).
6. Jpn. J. Appl. Phys. 43, L180-82 (2004).
7. J. Cryst. Growth 260, 166-70 (2004).
8. Appl. Phys. Lett. 84, 855-857 (2004)
9. Proceeding of International Symposium on Blue Laser and Light Emitting Diodes (1996), 113.
10. New Semiconductor Materials, Characteristics and Properties, Ioffe Physico-Technical Institute, Russian Federation, 1998.
11. New Semiconductor Materials, Characteristics and Properties, Ioffe Physico-Technical Institute, Russian Federation, 1998, Thermochimica Acta 430, 155-65 (2005).

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for producing a direct wafer bonded optical device, wherein light passes through one or more transparent ZnO conductor layers, comprising:
   (a) preparing flat and clean surfaces for one or more transparent ZnO conductor layers and a III-nitride optoelectronic device to be bonded; and
   (b) performing a direct wafer bonding process between the III-nitride optoelectronic device and a Zn face of the transparent ZnO conductor layers to form at least one wafer bonding interface that is a fusion of the transparent ZnO conductor layers and the III-nitride optoelectronic device, wherein an O face of the transparent ZnO conductor layers is shaped to improve light extraction from the transparent ZnO conductor layers.

2. The method of claim 1, wherein the III-nitride optoelectronic device and the transparent ZnO conductor layers are joined together and then wafer bonded in a nitrogen ambient under uniaxial pressure at a set temperature for a set duration.

3. The method of claim 1, wherein the transparent ZnO conductor layers surfaces to be bonded comprise the Zn-face of c-plane ZnO.

4. The method of claim 1, wherein the transparent ZnO conductor layers surfaces to be bonded comprise the O-face of c-plane ZnO.

5. The method of claim 1, wherein the III-nitride optoelectronic device and the transparent ZnO conductor layers are loaded into a wafer-bonding furnace, and the furnace is heated to a temperature of 600° C. for 1 hour in an $N_2$ gas flow.

6. The method of claim 1, wherein a surface of the transparent ZnO conductor layers is plasma treated prior to the wafer bonding process to enhance electrical conductivity at the wafer bonding interface.

7. The method of claim 1, wherein a surface of the III-nitride optoelectronic device is partially shaped prior to the wafer bonding process to strengthen the wafer bonding interface.

8. The method of claim 1, wherein a surface of the transparent ZnO conductor layers is roughened or shaped after or before the wafer bonding process.

9. The method of claim 8, wherein the surface is an O-face of the ZnO.

10. The method of claim 8, wherein the shaping is by anisotropic etching.

11. The method of claim 10, wherein the anisotropic etching comprises a chemical etching.

12. The method of claim 11, wherein the etching is in Hydrochloric Acid (HCL) or diluted HCL.

13. An optical device fabricated by the method of claim 1.

* * * * *